United States Patent
Sakaguchi et al.

(10) Patent No.: US 6,294,478 B1
(45) Date of Patent: *Sep. 25, 2001

(54) FABRICATION PROCESS FOR A SEMICONDUCTOR SUBSTRATE

(75) Inventors: Kiyofumi Sakaguchi, Yokohama; Takao Yonehara, Atsugi, both of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/807,604

(22) Filed: Feb. 27, 1997

(30) Foreign Application Priority Data

Feb. 28, 1996 (JP) .................................... 8-041709

(51) Int. Cl.[7] .................................... H01L 21/00

(52) U.S. Cl. .................... 438/753; 438/756; 438/747; 148/33.2; 148/33.3; 148/33.5

(58) Field of Search .................... 438/747, 753, 438/756, FOR 106; 216/2, 90, 99; 148/33.2, 33.3, 33.4, 33.5

(56) References Cited

U.S. PATENT DOCUMENTS

| | | | |
|---|---|---|---|
| 5,277,748 | * 1/1994 | Sakaguchi et al. | 438/751 X |
| 5,371,037 | 12/1994 | Yonehara | 437/86 |
| 5,374,564 | 12/1994 | Bruel | 437/24 |
| 5,670,411 | * 9/1997 | Yonehara et al. | 438/753 X |
| 5,811,348 | 9/1998 | Matsushita et al. | 438/455 |
| 5,856,229 | 1/1999 | Sakaguchi et al. | 438/406 |
| 5,863,830 | 1/1999 | Bruel et al. | 438/478 |
| 5,869,387 | 2/1999 | Sato et al. | 438/459 |
| 6,107,213 | 8/2000 | Tayanaka | 438/762 |
| 6,121,117 | 9/2000 | Sato et al. | 438/459 |

FOREIGN PATENT DOCUMENTS

| | | |
|---|---|---|
| 0553860 | 8/1993 | (EP) . |
| 0757377 | 2/1997 | (EP) . |
| 050211128 | 8/1993 | (JP) . |
| 070045441 | 2/1995 | (JP) . |

OTHER PUBLICATIONS

H. Baumgart, et al., Extended Abstracts of ECS, 1st International Symposium on Wafer Bonding, pp–733 (1991).

C.E. Hunt, Extended Abstracts of ECS, 1st International Symposium on Wafer Bonding, pp–696 (1991).

Nagano et al., Institute of Electronics, Information and Communication Engineers, vol. 79, SSD 79–9549 (1979).

A. Van Veen et al., Mat. Res. Soc. Symp. Proc, 107 (1988, Material Res.1 Soc. Pittsburgh, Pennsylvania) p. 449.

Journal of Crystal Growth, vol. 63, No. 3, Oct. 11 (1983), pp. 547–553, K. Imai et al., "Crystalline Quality of Silicon Layer Formed by Fipos Technology".

(List continued on next page.)

*Primary Examiner*—William Powell
(74) *Attorney, Agent, or Firm*—Fitzpatrick, Cella, Harper & Scinto

(57) ABSTRACT

SOI substrates are fabricated with sufficient quality and with good reproducibility. At the same time, conservation of resources and reduction of cost are realized by reuse of the wafer and the like.

Carried out to achieve the above are a step of bonding a principal surface of a first substrate to a principal surface of a second substrate, the first substrate being Si substrate in which at least one layer of non-porous thin film is formed through a porous Si layer, a step of exposing the porous Si layer in a side surface of a bonding substrate comprised of the first substrate and the second substrate, a step of dividing the porous Si layer by oxidizing the bonding substrate, and a step of removing the porous Si and oxidized porous Si layer on the second substrate separated by the division of the porous Si layer.

57 Claims, 7 Drawing Sheets

OTHER PUBLICATIONS

Journal of the Electrochemical Society, vol. 138, No. 1, Jan. 1991, pp. 341–347, W. P. Maszara, "Silicon–On–Insulator by Wafer Bonding: A Review".

Journal of Electronic Materials, vol. 20, No. 3, Mar. 1991, pp. 267–277, C. Harendt et al., "Silicon on Insulator Material by Wafer Bonding".

Applied Physics Letters, vol. 64, No. 16, Apr. 18, 1994, pp. 2108–2110, T. Yonehara et al., "Epitaxial Layer Transfer by Bond and Etch Back of Porous Si".

The Bell System Technical Journal, vol. 35, 1956, pp. 332–347, A. Uhlir Jr., "Electrolytic Shaping of Germanium and Silicon".

Journal of the Electrochemical Society, vol. 127, No. 2, Feb. 1980, pp. 476–483, T. Unagami, "Formation Mechanism of Porous Silicon Layer by Anodization in HF Solution".

Solid–State Electronics, vol. 24, pp. 159–164, 1981, K. Imai, "A New Dielectric Isolation Method Using Porous Silicon".

Applied Physics Letters, vol. 42, No. 4, Feb. 15, 1983, pp. 386–388, R.P. Holmstrom et al., "Complete Dielectric Isolation by Highly Selective and Self–Stopping Formation of Oxidized Porous Silicon".

Applied Physics Letters, vol. 66, No. 26, Jun. 26, 1995, pp. 3654–3656, V. Raineri et al., "Silicon–on–Insulator Produced by Helium Implantation and Thermal Oxidation".

K. Barla, "SOI Technology Using Buried Layers of Oxidized Porous Si", IEEE Circuits and Devices Magazine, Nov. 1987, pp. 11–15.

Patent Abstracts of Japan, vol. 096, No. 003, Mar. 29, 1996 (JP 07–302889).

* cited by examiner

FABRICATION PROCESS FOR A SEMICONDUCTOR SUBSTRATE

BACKGROUND OF THE INVENTION

1. Field of the Invention

The present invention relates to a fabrication process for a semiconductor substrate and, more particularly, to a process for fabricating a single-crystal semiconductor on a dielectric isolation or an insulator and a single-crystal compound semiconductor on Si substrate and further to a process for fabricating a semiconductor substrate suitable for electronic devices and integrated circuits made in a single-crystal semiconductor layer.

2. Related Background Art

Formation of a single-crystal Si semiconductor layer on an insulator is widely known as Si On Insulator (SOI) technology and much research has been focused thereon, because devices obtained utilizing the SOI technology have many advantages that cannot be achieved by the normal bulk Si substrates for fabrication of Si integrated circuits. Namely, use of SOI technology can enjoy the following advantages, for example:

1. Dielectric isolation is easy and high integration is possible.
2. Radiation resistance is high.
3. Stray capacitance is reduced and the operation speed can be enhanced.
4. The well process can be omitted.
5. Latch-up can be prevented.
6. Fully depleted field effect transistors can be fabricated by thin-film structure. These advantages are described in further detail, for example, in the reference [Special Issue: "Single-crystal silicon on non-single-crystal insulators"; edited by G. W. Cullen, Journal of Crystal Growth, volume 63, no 3, pp 429–590 (1983)].

In recent years, many reports have been presented on the SOI as a substrate focused on increase of speed and decrease of consumption power of MOSFET (IEEE SOI conference 1994). Since the SOI structure has an insulating layer below the device, use thereof can simplify the device isolation process as compared with forming the devices on a bulk Si wafer, which results in shortening the device process steps. Namely, in addition to the increase in performance, the total costs including the wafer cost and the process cost are expected to be lower than those of MOSFETs and ICs on bulk Si.

Among others, the fully depleted MOSFETs are expected to increase the speed and decrease the consumption power due to an improvement in driving force. The threshold voltage (Vth) of MOSFET is determined in general by an impurity concentration of the channel portion, and, in the case of the fully depleted (FD) MOSFETs using the SOI, the thickness of a depletion layer is also influenced by the film thickness of the SOI. Accordingly, evenness of the film thickness of SOI is highly desirable for fabricating large-scale integrated circuits with good yields.

On the other hand, the devices on a compound semiconductor have high performance that cannot be attained by Si, for example, high-speed operation, radiation of light, and so on. Presently, most of these devices are fabricated in a layer epitaxially grown on a compound semiconductor substrate of GaAs or the like. The compound semiconductor substrates, however, have problems such as high expensive, low mechanical strength, difficulty in fabricating a large-area wafer, etc.

Because of these problems, attempts have been made to hetero-epitaxially grow a compound semiconductor on the Si wafer, which is cheap, has high mechanical strength, and permits fabrication of a large-area wafer.

Returning to the SOI structure, research on formation of SOI substrates has been active since the 1970s. In the early stage, much research was focused on a method for hetero-epitaxially growing single-crystal Si on a sapphire substrate as an insulator (SOS: Silicon on Sapphire), a method for forming the SOI structure by dielectric isolation based on oxidation of porous Si (FIPOS: Full Isolation by Porous Oxidized Silicon), and an oxygen ion implantation method.

The FIPOS method is a method for forming an n-type Si layer in an island pattern on a surface of a p-type Si single-crystal substrate by proton implantation (Imai et al., J. Crystal Growth, vol 63, 547 (1983)) or by epitaxial growth and patterning, making only the p-type Si substrate porous from the surface, so as to surround Si islands by anodization in HF solution, and then dielectric-isolating the n-type Si islands by enhanced oxidation. This method has a problem in that degrees of freedom on device designing are limited, because the Si regions isolated are determined prior to the device processes.

The oxygen ion implantation method is called SIMOX, which was first reported by K. Izumi. Oxygen ions are first implanted in about $10^{17}$ to $10^{18}/cm^2$ into Si wafer, and thereafter the wafer is annealed at a high temperature of approximately 1320° C. in an argon-oxygen atmosphere. As a result, the oxygen ions implanted around the depth corresponding to the projected range (Rp) of ion implantation are bound with Si to form an oxidized Si layer. At that point, a Si layer, amorphized by the oxygen ion implantation above the oxidized Si layer, is also recrystallized to form a single-crystal Si layer. Crystalline defects in the surface Si layer were as many as $10^5/cm^2$ before, but they were successfully decreased to below $10^2/cm^2$ by adjusting the amount of implantation of oxygen to approximately $4\times10^{17}/cm^2$. However, the film thicknesses of the surface Si layer and the buried, oxidized Si layer (BOX; Buried Oxide) were limited to specific values due to narrow ranges of implantation energy and implantation dose capable of maintaining the film quality of the oxidized Si layer, crystallinity of the surface Si layer, and so on. Sacrificial oxidation or epitaxial growth was necessary for obtaining the surface Si layer in a desired film thickness. In that case, there is a problem that evenness of film thickness is degraded, because degradation due to these processes is added on the distribution of film thickness.

It is also reported that malformed regions of oxidized Si called pipes exist in the BOX. One of causes thereof is conceivably contaminations such as dust upon implantation. In the portions including the pipes, degradation of device characteristics occurs due to leakage between the active layer and the support substrate.

Since the implantation dose in the ion implantation of SIMOX is larger than in the ion implantation used for the normal semiconductor processes as described previously, the implantation time is still long even after dedicated equipment has been developed. Since the ion implantation is carried out by raster scan of an ion beam of a predetermined electric current amount or by expanding the beam, an increase in the implantation time is anticipated with an increase in the area of wafer. In high-temperature annealing of a large-area wafer, it is pointed out that the problem of generation of slip or the like due to the temperature distribution within the wafer becomes more severe. Annealing at high temperatures, such as 1320° C., which are not used normally in the Si semiconductor processes, is indispensable for the SIMOX, and there is thus such a concern that the above problem becomes more significant, including development of equipment.

Aside from the conventional SOI forming methods described above, attention has recently focused on another method for bonding Si single-crystal substrate to another Si single-crystal substrate thermally oxidized, by annealing or with an adhesive, thereby forming the SOI structure. This method requires evenly thinning the active layer for the device. In other words, it is necessary to thin the Si single-crystal substrate even several hundred $\mu$m thick down to the order of $\mu$m or less. The following three types of methods are available for this thinning:

(1) thinning by polishing
(2) thinning by localized plasma etching
(3) thinning by selective etching.

It is difficult to achieve uniform thinning by the polishing method of (1). In particular, several ten % of dispersion appears in thinning on the sub-$\mu$m order, and evening of this dispersion is a big problem. The degree of difficulty increases with further increases in the diameter of a given wafer.

The above method of (2) is used to thin the layer roughly by the method of polishing of (1) to about 1 to 3 $\mu$m and to measure a distribution of film thicknesses at multiple points over the entire surface. After that, based on this distribution of film thicknesses, the layer is etched to correct the distribution of film thicknesses by scanning it with a plasma using $SF_6$ or the like in the diameter of several mm, whereby the layer is thinned down to a desired film thickness. It is reported that this method can achieve the film thickness distribution of about ±10 nm. However, if there are contaminants (particles) on the substrate upon plasma etching, the contaminants will serve as an etching mask, thereby forming projections on the substrate.

Since the surface is rough immediately after etching, touch polishing is necessary after completion of the plasma etching. Control of the amount of polishing is carried out by time management, and thus control of degradation of the final film thickness and of the film thickness distribution by polishing is possible. Further, because in polishing, an abrasive such as colloidal silica directly rubs the surface to become the active layer, concerns exist about formation of a crush layer and introduction of work strain by polishing. As the wafers further increase in area, the time for plasma etching also increases proportionally which also raises another concern about an extreme drop of throughput.

The above method of (3) is a method for preliminarily forming a selectively etchable film structure in a substrate to be thinned. For example, a thin layer of p$^+$-Si containing boron in a concentration of $10^{19}$ or more/cm$^3$ and a thin layer of p-type Si are stacked on a p-type substrate by the method of epitaxial growth or the like, thereby obtaining a first substrate. This is bonded to a second substrate through an insulating layer of oxide film or the like and thereafter the back face of the first substrate is preliminarily thinned by grinding and polishing. After that, the p$^+$-layer is exposed by selective etching of the p-type substrate and the p-type thin layer is exposed by selective etching of the p$^+$-layer, thus completing the SOI structure. This method is described in detail in the report of Maszara (J. Electrochem. Soc. 138, 341 (1991)).

Although the selective etching is said to be effective for uniform thinning, it has the following problems:

The etch selectivity is not sufficient, at most $10^2$.

It requires touch polishing after etching, because the surface flatness after etching is poor. This, however, results in a decrease in the film thickness and a tendency to degrade the uniformity of film thickness. Polish amounts are managed by polishing time polishing, but rates vary greatly, which makes controlling the amount of polish difficult. Accordingly, a problem arises particularly in forming a very thin SOI layer, for example, 100 nm thick.

Crystallinity of the SOI layer is poor due to use of ion implantation and epitaxial growth or hetero-epitaxial growth on the high-concentration-B-doped Si layer. The surface flatness of the bonded surfaces are inferior to normal Si wafers.

Thus, the method of (3) has the above problems (C. Harendt, et al., J. Elect. Mater. Vol. 20, 267 (1991), H. Baumgart, et al., Extended Abstract of ECS 1st International Symposium of Wafer Bonding, pp-733 (1991); C. E. Hunt, Extended Abstract of ECS 1st International Symposium of Wafer Bonding, pp-696 (1991)). Also, the selectivity of selective etching is greatly dependent on concentration differences of impurities of boron or the like and steepness of its depthwise profile. Therefore, if high-temperature bonding annealing is conducted in order to enhance the bonding strength, or if high-temperature epitaxial growth is conducted in order to improve crystallinity, the depthwise distribution of impurity concentration will expand to degrade the etch selectivity. This illustrates the difficulty in realizing both an improvement in etch selectivity and an improvement in bonding strength.

Recently, Yonehara et al., solving such problems, reported the bonding SOI excellent in uniformity of film thickness and in crystallinity and capable of being batch-processed (T. Yonehara, K. Sakaguchi and N. Sato, Appl. Phys. Lett. 64, 2108 (1994)). This method uses a porous layer 42 on an Si substrate 41, as a material of selective etching. A non-porous single-crystal Si layer 43 is epitaxially grown on the porous layer and thereafter it is bonded to a second substrate 44 through an oxidized Si layer 45 (FIG. 14). The first substrate is thinned from its back surface by a method of grinding or the like, to expose the porous Si 42 across the entire surface of substrate (FIG. 15). The porous Si 42 thus exposed is removed by etching with a selective etchant such as KOH or $HF+H_2O_2$ (FIG. 16). At this time, the etch selectivity of porous Si to bulk Si (non-porous single-crystal Si) is sufficiently high, about 100,000. Hence, the non-porous single-crystal Si layer preliminarily grown on the porous layer can be left on the second substrate with little reduction of film thickness thereof, thus forming the SOI substrate. Therefore, the uniformity of film thickness of SOI is determined almost upon epitaxial growth. Since the epitaxial growth allows use of the CVD system used in the normal semiconductor processes, it realized the uniformity thereof, for example 100 nm±within 2%, according to the report of Sato et al. (SSDM 95). Also, the crystallinity of the epitaxial Si layer was reported to be as good as $3.5 \times 10^2/cm^2$.

Since in the conventional methods the etch selectivity depended on the differences of impurity concentration and the depthwise profile, temperatures of thermal treatments (bonding, epitaxial growth, oxidation, etc.) to expand the concentration distribution were greatly restricted to below approximately 800° C. On the other hand, in the etching of this method, the etch rate is determined by the difference of structure between porous and bulk, and thus there is little restriction on the temperature of the thermal treatments. It is reported that thermal treatment at about 1180° C. is possible. For example, annealing after bonding is known to enhance the bonding strength between wafers and to decrease the number and size of vacancies (voids) occurring in the bonding interface. In such etching based on the structural difference, particles deposited on porous Si at the etching process, if present, do not affect the uniformity of film thickness.

However, the semiconductor substrate using bonding always requires two wafers, most of one of which is wastefully removed and discarded by polishing, etching, etc., which would result in wasting the earth's limited resources.

Accordingly, SOI by bonding, according to the existing methods, has a lot of problems in the regarding controllability, uniformity, and cost efficiency.

Recently, Sakaguchi et al. reported a method for reusing the first substrate, which was consumed in the above bonding method (Japanese Patent Application No. 07-045441 (1995)).

They employed the following method in place of the step of thinning the first substrate from the back surface by the method of grinding, etching, and the like to expose porous Si in the bonding plus etchback process using porous Si as described above.

A surface layer of a first Si substrate 51 is made porous to obtain a porous layer 52, a single-crystal Si layer 53 is formed thereon, and this single-crystal Si layer 53 and first Si substrate is bonded through an insulating layer 55 with a principal surface of second Si substrate 54 (FIG. 17). After this, the bonding wafer is divided at the porous layer (FIG. 18), and the porous Si layer exposed in the surface on the second Si substrate side is selectively removed, thereby forming an SOI substrate (FIG. 19).

Division of the bonding wafer is effected by using a method for breaking the porous Si layer, for example, a method for applying sufficient tension or pressure perpendicularly to and uniformly in the surface of the bonding wafer, a method for applying wave energy of ultrasonic wave or the like, a method for exposing the porous layer on the side face of wafer, etching some of the porous layer, and inserting an edge of a razor into the porous layer, a method for exposing the porous layer on the side face of wafer, infiltrating a liquid such as water into the porous Si layer, and thereafter expanding the liquid by heating or cooling the entire bonding wafer, a method for applying force horizontally onto the second (or first) substrate relative to the first (or second) substrate, or the like.

These methods are all based on the idea that the mechanical strength of porous Si, depending upon its porosity, is sufficiently less than that of bulk Si. For example, with a porosity of 50%, the mechanical strength of porous Si may be considered to be half that of bulk Si. Namely, when compression, tension or shear force is exerted on the bonding wafer, the porous Si layer is broken first. With a greater porosity, the porous layer can be broken by a weaker force.

However, when force is exerted vertically or horizontally on the surface of wafer, the wafer is sometimes elastically deformed, thereby failing to properly exert force on the porous layer. This is observed because the semiconductor substrate is not a perfectly rigid body, but rather is an elastic body and this also depends on the method of supporting a given wafer.

Similarly, with the method for inserting an edge of a razor or the like through the side surface of wafer, the yields were extremely lowered in some cases where the thickness of the razor was not sufficiently thin or where the razor did not have sufficiently high rigidity.

Also, the razor was not able to be inserted uniformly from the periphery or the force was exerted from the outside on the bonding wafer. As a result, if the bond strength of the bonding surface was weaker than the strength of the porous Si layer or if there existed a locally weak portion, the two wafers were split at the bonding surface, thereby sometimes failing to achieve the initial purpose.

Accordingly, a desire exists for a method for fabricating SOI substrates of sufficient quality with good reproducibility and, at the same time, realizing conservation of resources and reduction of cost by re-use of a wafer or the like.

The bulletin of Japanese Laid-open Patent Application No. 5-211128 (1993) describes a proposal for a method for forming a bubble layer by ion implantation, annealing it to cause rearrangement of crystal and cohesion of bubbles, and dividing the wafer through the bubble layer, wherein optimization of annealing is not easy and is carried out at low temperatures of 400 to 600° C. Annealing at such low temperatures cannot suppress generation of voids as described above, and the voids once generated cannot be nullified even with re-annealing at high temperature after thinning. Namely, the decrease in the number and size of voids is a phenomenon that occurs when the two wafers are annealed at high temperature in the bonded state, and high-temperature annealing after thinning will increase the strength of the adhesive portion, but will not decrease the voids.

The above description concerns the problems related to the SOI technology by bonding. There are also demands as to the SOI technology regarding formation of a single-crystal layer on a light transparent substrate, formation of a compound semiconductor layer on a substrate, and so on, for the following reasons:

The light transparent substrate is important in constructing contact sensors which serve as light receiving elements, and projection type liquid crystal image display devices. Further, high-performance drive elements are necessary for realizing higher-density, higher-resolution, and higher-definition of pixels (picture elements) in the sensors and display devices. As a result, the devices provided on the light transparent substrate need to be fabricated using a single-crystal layer having excellent crystallinity. Use of the single-crystal layer enables peripheral circuits for driving the pixels and circuits for image processing to be incorporated in the same substrate as the pixels, thereby realizing size reduction and speed enhancement of a given chip.

However, the light transparent substrate typified by glass has disorderliness as to its crystal structure in general, and a thin Si layer deposited thereon is an amorphous layer or, at best, a polycrystal layer, reflecting the disorderliness of the substrate. High-performance devices cannot be fabricated of such a substrate. Namely, because of a crystal structure with many imperfections, it is not easy to fabricate drive elements of amorphous and polycrystal Si having sufficient performance that is required now or in the future. It is because the crystal structure of the substrate is amorphous, and simple deposition of Si layer will not yield a single-crystal layer with good quality.

On the other hand, substrates of compound semiconductor are necessary and indispensable for fabricating devices of compound semiconductor, but the substrates of compound semiconductor are expensive and it is very difficult to form a large area of compound semiconductor. For these reasons, attempts have been made to hetero-epitaxially grow a compound semiconductor of GaAs or the like on the Si wafer, which can be fabricated as a large-area wafer.

However, the thus grown film has poor crystallinity because of differences of lattice constant and coefficient of thermal expansion and it is thus very difficult to apply it to devices.

It is, therefore, an object of the present invention to provide a process for fabricating a film with good crystallinity and to provide a process for fabricating a semiconductor substrate, which can effectively use the semiconductor substrate as a material and which can suitably achieve conservation of resources and reduction of cost.

SUMMARY OF THE INVENTION

The inventor has made strenuous efforts to achieve the above object and obtain the following invention. Namely, a first fabrication process for a semiconductor substrate according to the present invention is a fabrication process comprising: a step of bonding a principal surface of a first substrate to a principal surface of a second substrate, the first substrate being an Si substrate in which at least one layer of non-porous thin film is formed through a porous Si layer; a step of exposing the porous Si layer in a side surface of a bonding substrate comprised of the first substrate and the second substrate; a step of dividing the bonding substrate in the porous Si layer by oxidizing the bonding substrate; and a step of removing a porous Si and oxidized porous Si layer on the second substrate separated by the division of the bonding substrate in the porous Si layer.

Further, a second fabrication process for a semiconductor substrate according to the present invention is a fabrication process comprising: a step of bonding a principal surface of a first substrate to a principal surface of a second substrate, the first substrate being a Si substrate in which at least one layer of non-porous thin film is formed through a porous Si layer and in which the porous Si layer is exposed in a side surface thereof; a step of dividing the bonding substrate in the porous Si layer by oxidizing a bonding substrate comprised of the first substrate and the second substrate; and a step of removing a porous Si and oxidized porous Si layer on the second substrate separated by the division of the bonding substrate in the porous Si layer.

Also, a third fabrication process for a semiconductor substrate according to the present invention is one according to the above first or second fabrication process, wherein after removing the porous Si and oxidized porous Si layer on the first substrate separated by the division of the bonding substrate in the porous Si layer, the first substrate is again used as a raw material for the first substrate before bonding.

In addition, a fourth fabrication process for a semiconductor substrate according to the present invention is one according to the above first or second fabrication process, wherein after removing the porous Si and oxidized porous Si layer on the first substrate separated by the division of the bonding substrate in the porous Si layer, the first substrate is again used as a raw material for the second substrate before bonding.

Moreover, a fifth fabrication process for a semiconductor substrate according to the present invention is one according to any of the above first to fourth fabrication processes, wherein at least one layer of non-porous thin film is formed through a porous Si layer on each of two principal surfaces of the first substrate and the second substrate is bonded to each of the two principal surfaces.

The present invention utilizes enhanced oxidation of porous Si to oxidize the porous Si layer from the periphery of the wafer, whereby volume expansion of porous Si becomes greater from the center to the periphery. This seems as if porous Si is uniformly wedged from the periphery, so that the internal pressure is exerted on only the porous layer, and it splits the wafer in the porous Si layer therethrough across the entire surface of the wafer. This provides a fabrication process for a semiconductor substrate solving the various problems discussed above.

Namely, in the case of the bonding substrate having a multi-layered structure, if the method of splitting at porous Si by external pressure is applied and if the substrate has an interface with low strength or a partially weak region, the substrate will be split at the weak portion. In contrast, the present invention permits the internal pressure to be exerted only on the porous Si layer by utilizing oxidation, one step of the normal Si-IC processes, excellent in uniformity, and by combining high-speed oxidizability of porous Si, volume expansion of porous Si, and fragility of porous Si, whereby the wafer can be split with good controllability in and through the porous Si layer.

Further, use of the process according to the present invention enables reuse of the first Si substrate after removal of the porous substrate portion. This first Si substrate can be reused any number of times before it becomes unusable with respect to its mechanical strength.

The present invention permits separation through the porous layer over a large area in removing the first Si substrate. The first Si substrate thus removed can be reused again as a first Si substrate or as a second substrate after removing the residual porous layer or after flattening the surface if the surface is too rough. The surface flattening process may be polishing, etching, or any other method used in the normal semiconductor processes, but may be annealing in an atmosphere containing hydrogen. By selecting suitable conditions for this annealing, the surface can be flattened so as to reveal atomic steps locally. In the case of repetitive use as a first Si substrate, this first Si substrate can be reused any number of times before it becomes unusable with respect to its mechanical strength.

Since the present invention permits division of a large area en bloc through the porous layer, it can obviate the need for the grinding, polishing, and etching steps conventionally essential for removing the first substrate to expose the porous Si layer, thereby decreasing the steps. In addition, the position of division can be defined at a limited depth in the porous Si layer by preliminarily performing ion implantation of at least one element chosen from rare gases, hydrogen, and nitrogen so as to have the projected range in the porous layer, which evens the thickness of the porous layer remaining on the second substrate side. Then the porous layer can be removed uniformly even with an etchant having low to moderate etch selectivity. Further, the conventional fabrication of a bonding substrate employed a method for successively removing the first Si layer from one surface by grinding and etching, therefore making it impossible to bond the two surfaces of the first Si layer with respective support substrates, thereby effectively utilizing both surfaces. In contrast, according to the present invention, the first Si substrate, except for the surface layer thereof, is maintained as it was, and two substrates can be fabricated simultaneously by bonding, dividing and thinning, with the aid of a first Si substrate by using both surfaces of the first Si substrate as principal surfaces and bonding support substrates to the respective surfaces, thereby raising productivity. Of course, the first Si substrate after division can be reused.

In addition, the present invention permits a large area to be divided en bloc through the porous layer in removing the first Si substrate. This method decreases processing steps, which is economically desirable, and can transfer a non-porous thin film such as Si single-crystal layer or a compound semiconductor single-crystal layer, which is uniformly flat across a large area and which has excellent crystallinity, to the second substrate at a good yield. Namely, the SOI structure with the Si single-crystal layer formed on the insulating layer can be attained with good uniformity of film thickness and at a good yield.

In other words, the present invention provides the Si single-crystal layer or the compound semiconductor single-crystal layer with a remarkably reduced number of imperfections on the insulator by using a Si single-crystal substrate in an economically desirable manner, which results in uniform flatness across a large area, and excellent crystallinity, by removing the portion from its one surface to the active layer and leaving the Si or compound semiconductor active layer formed on the surface.

The present invention provides a fabrication process for a semiconductor substrate superior with respect to productivity, uniformity, controllability, and cost in obtaining the Si or compound semiconductor single-crystal layer with excellent crystallinity equivalent to that of a single-crystal wafer, on a transparent substrate (light transmissive substrate).

The fabrication process for a semiconductor substrate according to the present invention involves performing selective etching with outstandingly excellent etch selectivity, thereby enabling one to obtain Si single crystal or compound semiconductor single crystal which is uniformly flat across a large area and which has excellent crystallinity.

Further, removal of the porous Si layer of the present invention can also be done by selective polishing, using the single-crystal layer as a polishing stopper because porous Si has low mechanical strength and enormous surface area.

Also, the present invention can provide a fabrication process for a semiconductor substrate that can replace the expensive SOS or SIMOX for fabricating large-scale integrated circuits of the SOI structure.

The present invention can form a single-crystal compound semiconductor layer with good crystallinity on porous Si, can transfer the semiconductor layer onto an economically desirable and large-area insulating substrate, and can form the compound semiconductor layer with good crystallinity on the insulating substrate while restraining the differences in lattice constant and coefficient of thermal expansion, which were problems in the prior art.

In the present invention, a layer of a material having a smaller coefficient of thermal expansion than that of Si is formed at least on one side of the outer surfaces of the bonding substrate before splitting by oxidation (or possibly before bonding), whereby at temperatures during oxidation, Si becomes more likely to expand and thus stress acts in the wafer peeling directions in the peripheral region of the bonding wafer, facilitating occurrence of the wedge effect by oxidation.

Also, in the case where regions without an implant layer are formed due to the existence of contaminations on the surface upon ion implantation, because the mechanical strength of the porous layer itself is smaller than that of bulk Si, peeling occurs in the porous layer, so that the two substrates bonded can be divided without extending damages such as cracks to the non-porous single-crystal Si layer.

Since the ion implant region has the gettering effect, metal impurities, if present, can be subject to gettering by the ion implant region and thereafter the ion implant region with the impurities can be removed by separating the two substrates bonded. It is thus effective with respect to impurity contamination.

The present invention may combine anodization with ion implantation to make the porosity of the side surface small and the porosity of the central part large, thereby making the volume expansion of the side surface greater and the strength of the central part low so as to facilitate peeling.

DETAILED DESCRIPTION OF THE PREFERRED EMBODIMENTS

In the present invention, the porous Si layer is oxidized from the periphery of the wafer, utilizing enhanced oxidation of porous Si. Volume expansion of porous Si increases from the center toward the periphery, and the present invention thus has the same effect as porous Si as if uniformly wedged from the periphery. In that case, the internal pressure is exerted on only the porous Si layer and the wafer is divided in the porous Si layer throughout the entire surface. This provides a fabrication process for a semiconductor substrate which solves the various problems discussed previously.

Figure 1:
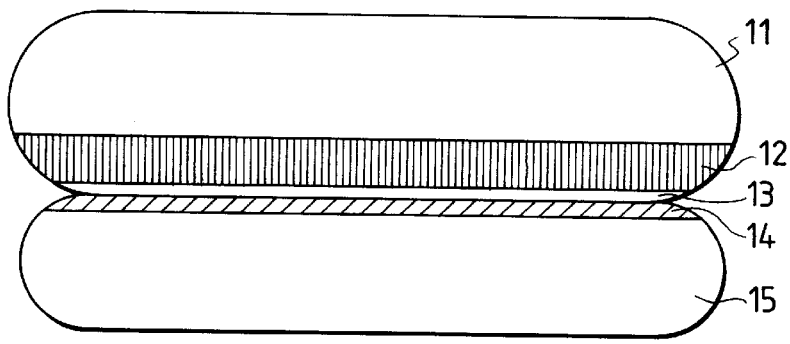
FIG. 1 is a schematic cross-sectional view for explaining the principle of the present invention.
Figure 2:
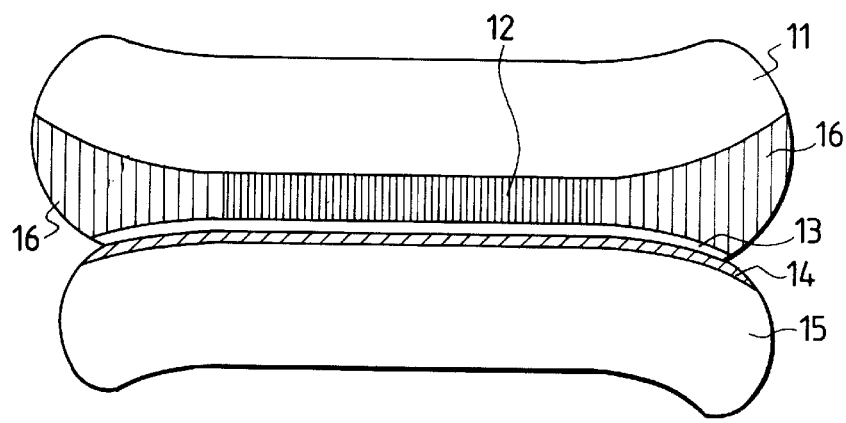
FIG. 2 is a schematic cross-sectional view for explaining the principle of the present invention.
Figure 3:
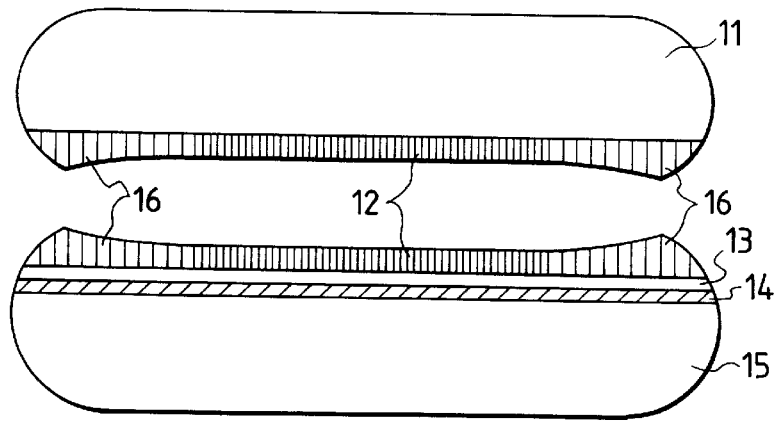
FIG. 3 is a schematic cross-sectional view for explaining the principle of the present invention.

The principle of division by oxidation as a basis of the present invention will be described with reference to FIG. 1 to FIG. 3. In FIG. 1 to FIG. 3, reference numeral 11 designates a first Si single-crystal substrate; 12, a porous Si layer; 13, a non-porous thin film; 14, an insulating layer; 15, a second substrate; and 16, an oxidized porous Si layer. Although FIG. 1 to FIG. 3 illustrate an embodiment in which the insulating layer has been formed on the surface of the second substrate, it may be formed on the first substrate or both of the first and second substrates. There are some cases such as GaAs on a Si p-n junction, where the insulating layer has been formed on neither of the substrates. FIG. 1 shows a bonding substrate immediately before oxidation. The side surface of porous Si is exposed. The side surface of porous Si is also normally covered by a non-porous thin film, and it is necessary to make the side surface exposed after or before bonding. When this bonding substrate is oxidized, enhanced oxidation starts from the side surface of porous Si because of the enormous surface area of porous Si. The volume expands 2.27 times when Si turns to $SiO_2$. Thus, if the porosity is not more than 56%, then the volume of the oxidized, porous Si layer will expand. The nearer the position to the center of wafer, the lower the degree of oxidation. Thus, the volume expansion of the oxidized porous Si layer near the side surface of wafer becomes greater as shown in FIG. 2. This is just the same condition as if wedges are driven into the porous Si layer from the side surface of wafer, and the internal pressure is exerted on only the porous Si layer, so that force acts so as to divide the substrate in porous Si. In addition, since oxidation uniformly progresses at the periphery of wafer, the bonding wafer will be split equally from the circumference of wafer. As a result, the wafer is divided as shown in FIG. 3. This oxidation step is a step used in the normal Si-IC processes and thus requires neither special facilities nor special techniques such as careful insertion of an edged tool.

The bonding substrate has the multi-layered structure, and, thus, if it has an interface of low strength or a locally weak region, the method of splitting at porous Si by external pressure would cause splitting at the weak portion. The present invention permits the internal pressure to be exerted on only the porous Si layer, utilizing one step, oxidation, with excellent uniformity of the normal Si-IC processes and combining the enhanced oxidizability of porous Si, volume expansion of porous Si, and fragility of porous Si, whereby the wafer can be divided with good controllability in the porous Si layer.

After the residual porous Si and oxidized porous Si layer is removed from the first Si substrate thus separated by the above method of the present invention, the first Si substrate is subjected to a surface flattening process, if surface flatness thereof is insufficient. Then the first Si substrate can be reused again as a first Si layer or as a second substrate.

The surface flattening process may be polishing, etching, or any other method used in the normal semiconductor processes, but may be annealing in an atmosphere containing hydrogen. By properly selecting the conditions for this annealing, the substrate can be flattened so as to expose atomic steps locally. The annealing in the atmosphere containing hydrogen may be carried out, for example, under such conditions as $H_2$ 100%, 1100° C., 2 hours; $H_2$/Ar=20/80, 1150° C., 1 hour; or $H_2$ 100%, 1050° C., 2 hours.

Since the present invention permits a large area to be divided en bloc through the porous layer, it can omit the grinding, polishing, and etching steps that were conventionally essential for removing the first substrate to expose the entire surface of porous Si layer, thus decreasing processing steps.

When the substrate separated is repetitively used as a first Si substrate, this first Si substrate can be reused any number of times before it becomes unusable with respect to its mechanical strength.

Further, since the conventional fabrication of a bonding substrate employs the method for successively removing the first Si substrate from one side thereof by grinding and etching, it is impossible to bond both surfaces of the first Si substrate to respective support substrates, thereby effectively utilizing the two surfaces. In contrast, according to the present invention, the first Si substrate, except for the surface layer, is maintained in its original state, and thus, by using both surfaces of the first Si substrate as principal surfaces and bonding the two surfaces to the respective support substrates, two substrates can be fabricated simultaneously by bonding, dividing, and thinning from one first Si substrate, thereby decreasing steps and improving productivity. Of course, the first Si substrate separated can be reused.

In other words, the present invention provides the Si single-crystal layer or the compound semiconductor single-crystal layer with a remarkably reduced number of imperfections on the insulator by using a Si single-crystal substrate in an economically desirable manner which results in uniform flatness across a large area, and excellent crystallinity, by removing the portion from its one surface to the active layer and leaving the Si or compound semiconductor active layer formed in the surface.

The present invention provides a fabrication process for semiconductor substrate superior with respect to productivity, uniformity, controllability, and cost in obtaining the Si or compound semiconductor single-crystal layer with excellent crystallinity equivalent to that of single-crystal wafer, on a transparent substrate (light transparent substrate).

Also, the present invention provides a fabrication process for a semiconductor substrate that can replace the expensive SOS or SIMOX for fabricating large-scale integrated circuits of the SOI structure.

The present invention can form a single-crystal compound semiconductor layer with good crystallinity on porous Si, can transfer the semiconductor layer onto an economically desirable and large-area insulating substrate, and can form the compound semiconductor layer with good crystallinity on the insulating substrate while restraining the differences in lattice constant and coefficient of thermal expansion, which were problems in the prior art.

Further, removal of the porous Si layer of the present invention can also be done by selective polishing, using the single-crystal layer as a polishing stopper because porous Si has low mechanical strength and enormous surface area.

The present invention may combine anodization with ion implantation to make the porosity of the side surface small and the porosity of the central part large, thereby making the volume expansion of the side surface greater and the strength of the central part low so as to facilitate peeling.

In the present invention, a layer of a material having a smaller coefficient of thermal expansion than that of Si is formed at least on one side of the outer surfaces of the bonding substrate before splitting by oxidation, (or possibly before bonding), whereby at temperatures during oxidation Si becomes more likely to expand and thus stress acts in the wafer peeling directions in the peripheral region of the bonding wafer, facilitating occurrence of the wedge effect by oxidation.

The present invention simultaneously solves the various problems discussed previously by the above-stated enhanced oxidation and volume expansion of porous layer effected uniformly from the periphery of a wafer.

Uhlir et al. discovered porous Si during the research process on electrolytic polishing of semiconductor in 1956 (A. Uhlir, Bell Syst. Tech. J., vol. 35, 333 (1956)). Porous Si can be formed by anodizing an Si substrate in HF solution. Unagami et al. studied dissolution of Si in the anodization and reported that the anode reaction of Si in HF solution required holes and that the reaction was as follows (T. Unagami, J. Electrochem. Soc., vol. 127, 476 (1980)):

$Si+2HF+(2-n)e^+ \rightarrow SiF_2+2H^++ne^-$ $SiF_2+2HF \rightarrow SiF_4+H_2$ $SiF_4+2HF \rightarrow H_2SiF_6$ or $Si+4HF+(4-\lambda)e^+ \rightarrow SiF_4+4H^++\lambda e^-$ $SiF_4+2HF \rightarrow H_2SiF_6$ Here, $e^+$ and $e^-$ represent a hole and an electron, respectively. Further, each of n and $\lambda$ is the number of holes necessary for one atom of Si to dissolve, and it is reported that porous Si is formed when the condition of $n>2$ or $\lambda>4$ is satisfied.

From the foregoing, p-type Si including holes can be changed to porous Si, but n-type Si cannot. The selectivity in this porous Si formation was verified by Nagano et al. and Imai (Nagano, Nakajima, Anno, Onaka, and Kajiwara, technical research report, the Institute of Electronics, Information and Communication Engineers (IEICE), vol. 79, SSD 79–9549 (1979)) and (K. Imai, Solid-State Electronics, vol. 24, 159 (1981)).

There is, however, another report telling that heavily doped n-type Si can be changed to porous Si (R. P. Holmstrom and J. Y. Chi, Appl. Phys. Lett., vol. 42, 386 (1983)), and it is thus important to select a substrate that can realize porous Si formation without adhering to the difference between p-type and n-type.

Porous Si can be formed by anodization of the Si substrate in HF solution. The porous layer has a spongelike structure in which pores with diameters ranging approximately from $10^{-1}$ to 10 nm are arranged at intervals of about $10^{-1}$ to 10 nm. The density thereof can be changed in the range of 2.1 to 0.6 g/cm³ by changing the concentration of HF solution in the range of 50 to 20% or by changing the current density, in comparison with the density of single-crystal Si 2.33 g/cm³. Namely, the porosity can vary. Although the density of porous Si is below half of that single-crystal Si as described, it maintains the single crystal property and it is also possible to epitaxially grow a single-crystal Si layer on the porous layer. However, temperatures over 1000° C. cause rearrangement of internal pores, which will impair the characteristic of enhanced etching. Therefore, the epitaxial growth of a Si layer is preferably low temperature growth selected from molecular beam epitaxial growth, plasma enhanced CVD, low pressure CVD, photo assisted CVD, bias sputter process, liquid phase growth, and so on. However, high-temperature growth is also possible, if a protective film is preliminarily formed over the pore walls of the porous layer by a method of low-temperature oxidation or the like.

Since a lot of pores are formed inside the porous layer, the density of the porous layer decreases by half or more. As a result, the surface area significantly increases as compared with the volume, and thus its chemical etching rate is remarkably enhanced as compared with the etching rates of a normal single-crystal layer.

The mechanical strength of porous Si is lower than that of bulk Si, though it depends upon the porosity. For example, if the porosity is 50%, the mechanical strength can be considered to be half that of bulk. Namely, when compression, tension or shear force is exerted on the bonding wafer, the porous Si layer will be broken first. When porosity increases the porous layer can be broken by weaker force.

It is reported that after ions of helium or hydrogen are implanted into bulk Si, followed by annealing, microcavities with diameters of several nm to several ten nm are formed in the density of even $10^{16-17}/cm^3$ in the implant region (for example, A. Van Veen, C. C. Griffioen, and J. H. Evans, Mat. Res. Soc. Symp. Proc. 107 (1988, Material Res. Soc. Pittsburgh, Pa.) p. 449). Research was recently conducted on utilization of the micro-cavities as gettering sites of metal impurities.

V. Raineri and S. U. Campisano implanted helium ions into bulk Si and annealed it to form the cavities. Thereafter, they formed a groove in the substrate to expose the side surface of the cavities and subjected it to oxidation. As a result, the cavities were selectively oxidized to form a buried, oxidized Si layer. Namely, they reported formation of the SOI structure thereby (V. Raineri, and S. U. Canpisano, Appl. Phys. Lett. 66 (1995) p. 3654). Their method, however, failed to form the SOI structure over the entire surface of substrate because the thicknesses of the surface Si layer and buried, oxidized Si layer are limited to those that can effect both the formation of cavities and relaxation of stress introduced due to volume expansion upon oxidation together and because formation of a groove is necessary for selective oxidation. Such formation of cavities has been reported as a phenomenon occurring with injection of a light element into metal, together with the swell and peeling phenomena of these cavities, as part of research related to the first wall of a fusion reactor.

The second substrate may be selected, for example, from Si substrate, Si substrate with an oxidized Si film formed thereon, light transparent substrates such as a quartz substrate (silica glass) or a glass substrate, and metal substrates, but it is not limited particularly to these.

The thin film formed on the porous Si layer on the first substrate may be selected, for example, from metal thin films and carbon thin films as well as non-porous single-crystal Si and the compound semiconductors such as GaAs or InP, but it is not limited to these. Further, it is not essential that the thin film of these be formed over the entire surface, and it may be partially etched by a patterning process.

The bonding wafer of Si has advantages of being oxidized at high temperatures and simultaneously annealed at high temperatures for reduction of voids.

Embodiments of the present invention will be explained.

[Embodiment 1]

Figure 4:
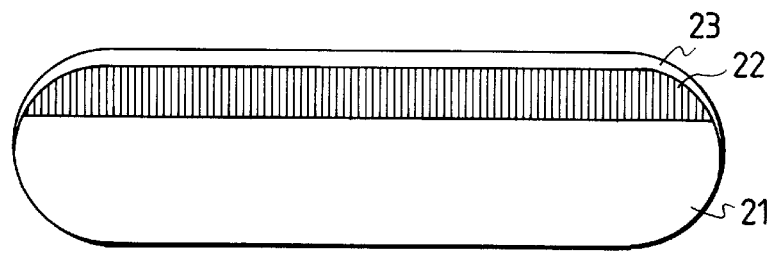
FIG. 4 is a schematic cross-sectional view for explaining a step of the present invention.

As shown in FIG. 4, a first Si single-crystal substrate 21 is first prepared and then at least one non-porous thin film 23 and a porous Si layer 22 immediately under it are formed over the outermost surface layer of the principal surface thereof. A procedure for fabricating the non-porous thin film 23 and porous Si layer 22 is one selected from the following procedures:

a) forming the porous Si layer 22 by anodization and forming the non-porous thin film 23;

b) implanting ions of at least one element selected from rare gases, hydrogen, and nitrogen into the substrate to simultaneously form the porous Si layer 22 and the non-porous thin film 23; and c) in addition to a), further implanting ions of at least one element selected from rare gases, hydrogen and nitrogen into the substrate to make another region with a different porosity.

Figure 5:
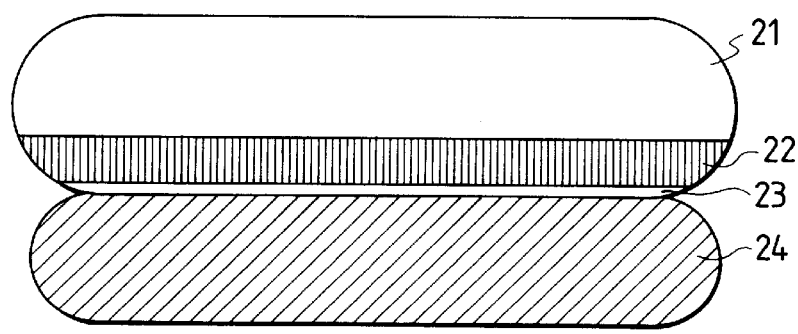
FIG. 5 is a schematic cross-sectional view for explaining a step of the present invention.

The non-porous thin film 23 is arbitrarily selected from single-crystal Si, polycrystal Si, amorphous Si, or metal films, compound semiconductor thin films, superconductive thin films, and so on. Even the device structure of MOSFET or the like may be formed. Further, formation of $SiO_2$ as an outermost layer is preferred for the reason that the interface state of the bonding interface can be separated away from the active layer (though $SiO_2$ does not always have to be provided). Observation of the implant layer with a transmission electron microscope confirms that an infinite number of micro-cavities are formed. There is no specific limitations on the charge state of implant ions. The acceleration energy is so set that the projected range is coincident with the depth desired to implant. The size and density of micro-cavities formed vary depending upon an implant amount, but the density is approximately $1\times10^{14}/cm^2$ or more, more preferably $1\times10^{15}/cm^2$. If the projected range is desired to set deeply, channeling ion implantation may be applied. After implantation, annealing is carried out as the occasion demands. As shown in FIG. 5, the second substrate 24 is made in close contact with the surface of the first substrate at room temperature. After that, bonding may be enhanced by anodic bonding, pressing, or annealing if necessary, or a combination thereof.

If single-crystal Si is deposited, it is preferred to form oxidized Si by a method of thermal oxidation or the like over the surface of single-crystal Si and then to bond it to the second substrate. The second substrate may be selected from Si, a substrate obtained by forming an oxidized Si film on an Si substrate, light transparent substrates of quartz or the like, sapphire, and the like, but it is not limited to these. The point is that a surface thereof to be bonded is sufficiently flat.

The two substrates may be bonded in the three-plate laminate structure with an insulating thin plate therebetween.

A layer of a material having a smaller coefficient of thermal expansion than Si may be formed on at least one side of the outer surfaces of the bonding substrate before splitting by oxidation (or possibly before bonding). At temperatures during oxidation, Si becomes easier to expand and stress acts in the wafer peeling directions around the periphery of the bonding wafer, thereby supplementing the wedge effect by oxidation.

Figure 6:
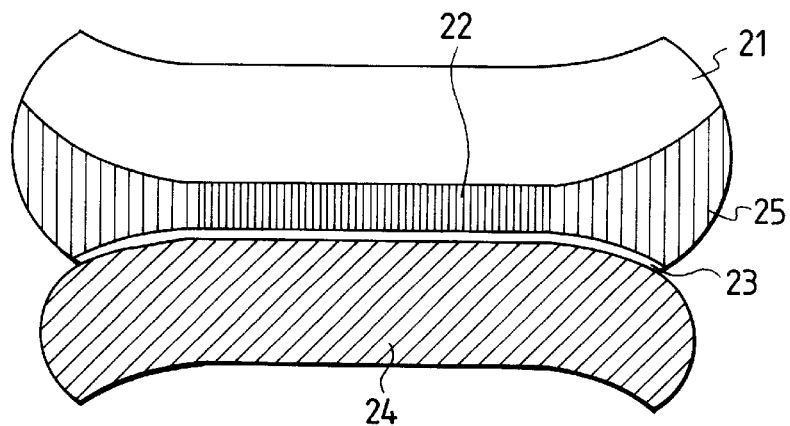
FIG. 6 is a schematic cross-sectional view for explaining a step of the present invention.
Figure 7:
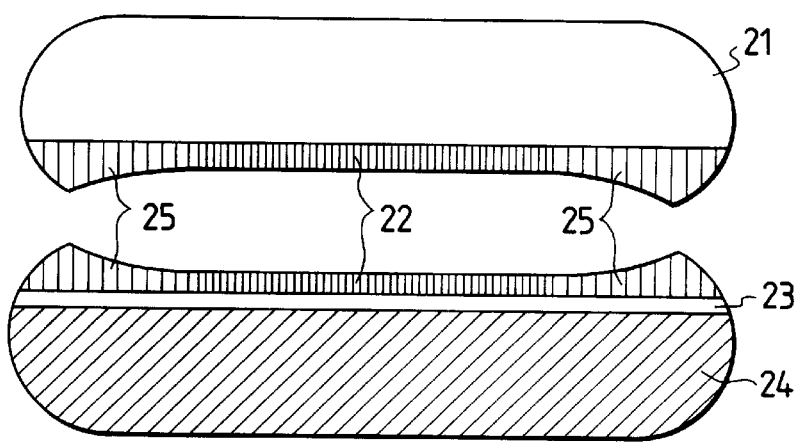
FIG. 7 is a schematic cross-sectional view for explaining a step of the present invention.

The side surface of the porous Si layer is made to be exposed by etching the non-porous thin film 23 after bonding, etching it before bonding, or preventing the non-porous thin film 23 from being formed on the side surface. The bonding substrate is oxidized to subject porous Si of the side surface to enhanced oxidation. (In the drawing, numeral 25 designates oxidized porous Si.) Then, as shown in FIG. 6, volume expansion of side-surface porous Si causes stress to act so as to peel the porous Si layer and, finally, to divide the substrate in the porous Si layer 22 (FIG. 7). The second substrate side has the structure of porous Si 22+oxidized porous Si 25/non-porous thin film (single-crystal Si layer, for example) 23/second substrate 24.

Further, the porous Si 22 and oxidized porous Si 25 is selectively removed. Oxidized porous Si 25 is etched with hydrofluoric acid solution. When the non-porous thin film is of single-crystal Si, only porous Si 22 is etched by electroless wet chemical etching with at least one etchant selected from ordinary Si etchants, hydrofluoric acid being an etchant for selective etching of porous Si, a mixture solution obtained by adding at least one of alcohol (ethyl alcohol, isopropyl alcohol, etc.) and hydrogen peroxide solution to hydrofluoric acid, buffered hydrofluoric acid, and a mixture solution obtained by adding at least one of alcohol and hydrogen peroxide to buffered hydrofluoric acid, thereby leaving the film preliminarily formed on the porous layer of the first substrate, on the second substrate. As detailed above, only porous Si can be selectively etched, even with the ordinary Si etchant, because of the enormous surface area of porous Si. Alternatively, porous Si 22 is removed by selective polishing, using the non-porous thin film layer 23 as a polishing stopper.

When a compound semiconductor layer is formed on the porous layer, only porous Si 22 is chemically etched with an etchant having a faster etch rate of Si than that of the compound semiconductor, thereby leaving and, thus forming, the thinned single-crystal compound semiconductor layer 23 on the second substrate 24. Alternatively, porous Si 22 is removed by selective polishing, using the single-crystal compound semiconductor layer 23 as a polishing stopper.

Figure 8:
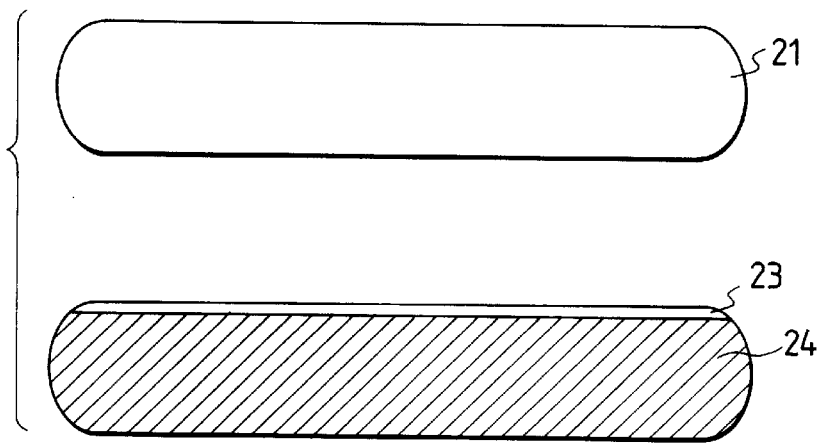
FIG. 8 is a schematic cross-sectional view for explaining a step of the present invention.
Figure 9:
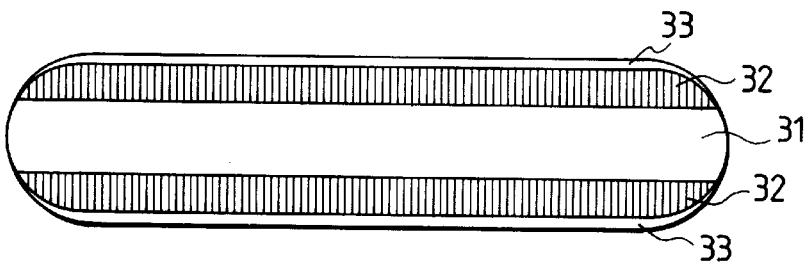
FIG. 9 is a schematic cross-sectional view for explaining a step of the present invention.
Figure 10:
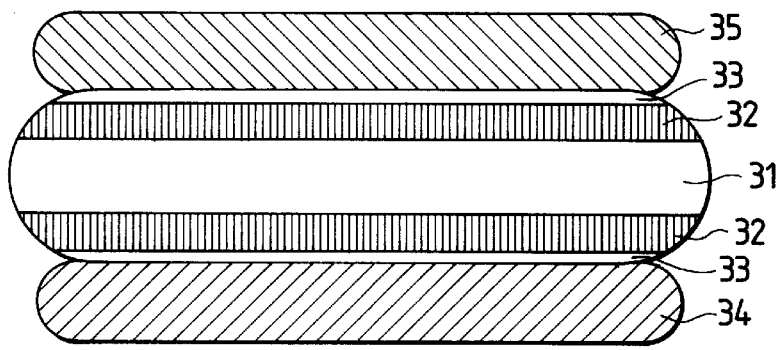
FIG. 10 is a schematic cross-sectional view for explaining a step of the present invention.
Figure 11:
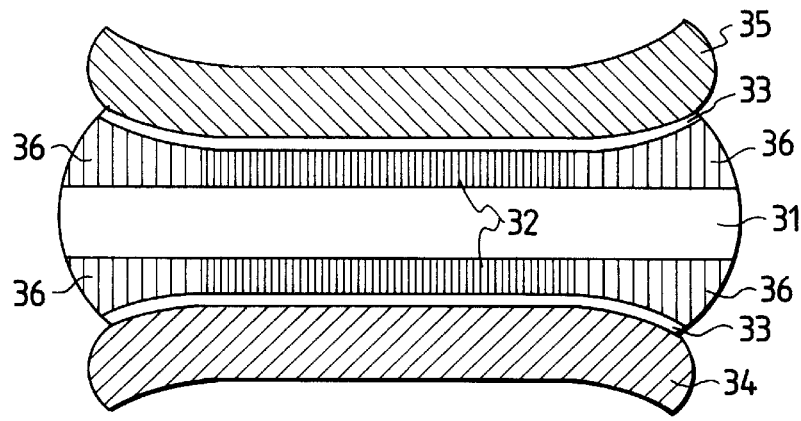
FIG. 11 is a schematic cross-sectional view for explaining a step of the present invention.
Figure 12:
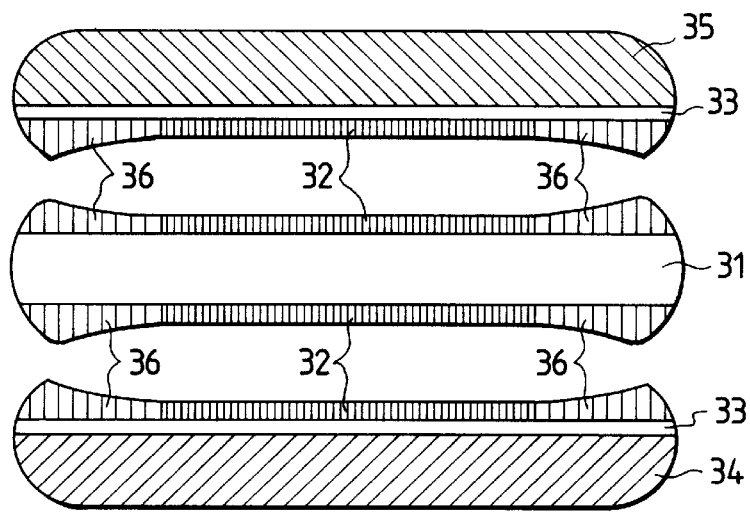
FIG. 12 is a schematic cross-sectional view for explaining a step of the present invention.
Figure 13:
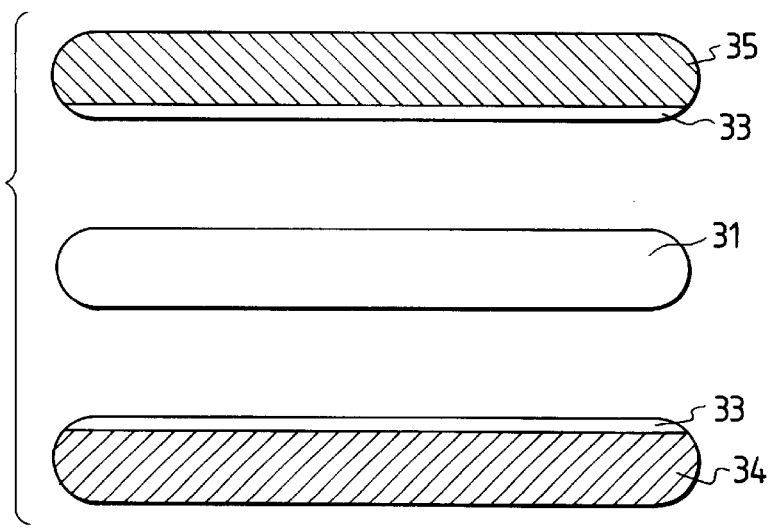
FIG. 13 is a schematic cross-sectional view for explaining a step of the present invention.
Figure 14:
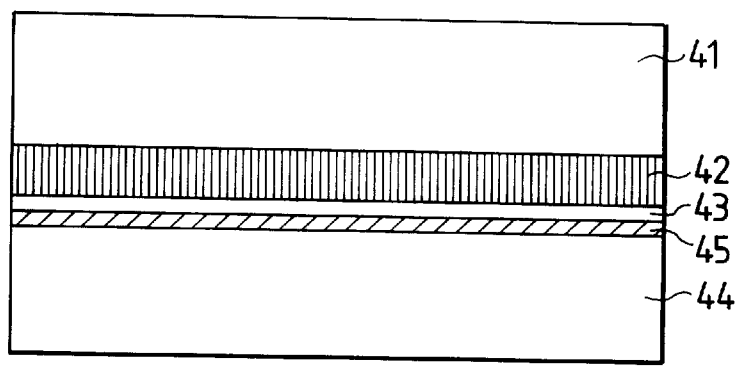
FIG. 14 is a schematic cross-sectional view for explaining a step of the conventional example.
Figure 15:
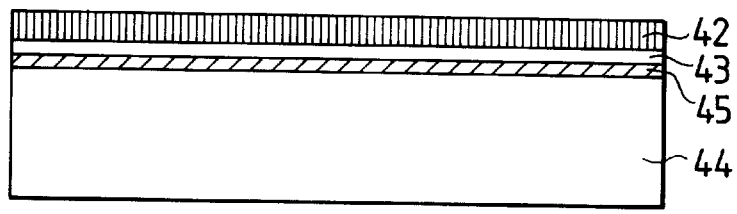
FIG. 15 is a schematic cross-sectional view for explaining a step of the conventional example.
Figure 16:
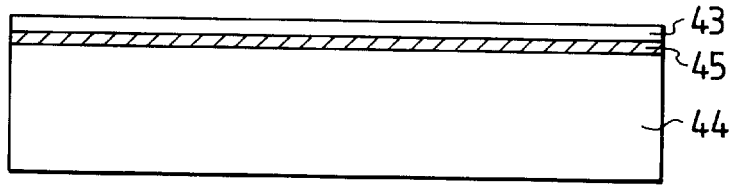
FIG. 16 is a schematic cross-sectional view for explaining a step of the conventional example.
Figure 17:
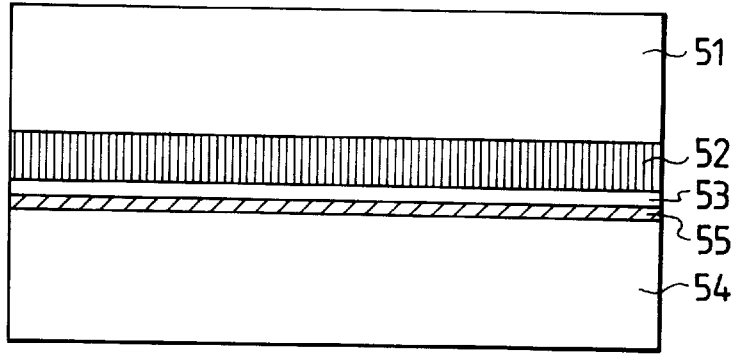
FIG. 17 is a schematic cross-sectional view for explaining a step of another conventional example.
Figure 18:
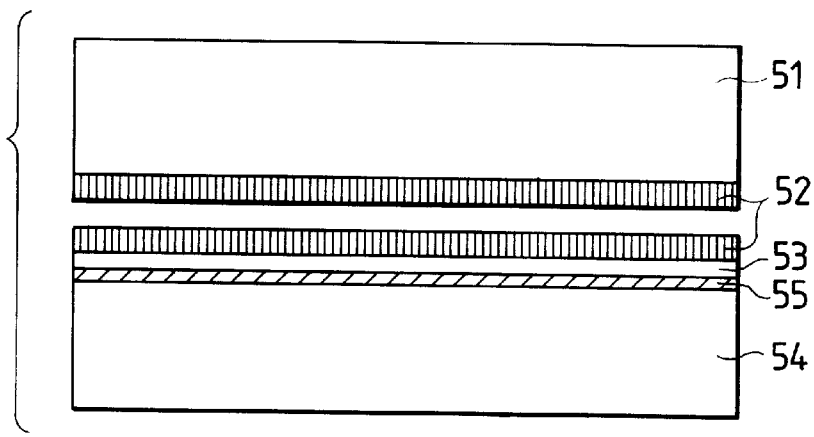
FIG. 18 is a schematic cross-sectional view for explaining a step of another conventional example.
Figure 19:
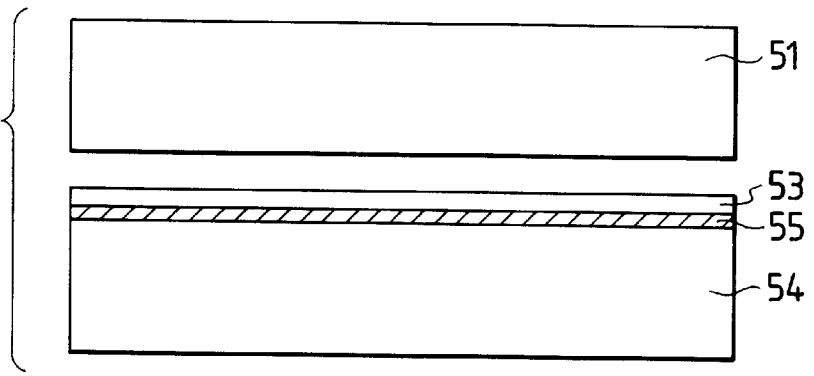
FIG. 19 is a schematic cross-sectional view for explaining a step of another conventional example.

FIG. 8 shows a semiconductor substrate obtained by the present invention. A non-porous thin film, for example, a single-crystal Si thin film 23, is formed, as thinned flatly and uniformly, in a large area throughout the entire region of wafer on the second substrate 24. If an insulating substrate is used as the second substrate 24, the semiconductor substrate thus obtained can be suitably used also from the viewpoint of fabrication of dielectric-isolated electronic devices.

The first Si single-crystal substrate 21 can be reused again as a first Si single-crystal substrate 21 or as a second substrate 24 after the residual porous Si and oxidized porous Si layer is removed and, if the surface thereof is too rough, after the surface thereof is flattened.

[Embodiment 2]

As shown in FIG. 9 to FIG. 13, the above step described in Embodiment 1 is applied to the both surfaces of the first substrate with two second substrates, thereby fabricating two semiconductor substrates simultaneously.

In FIG. 9 to FIG. 13, reference numeral 31 designates a first Si single-crystal substrate; 32, porous Si layers provided on the both principal surfaces of the first Si single-crystal substrate 31; 33, non-porous thin films provided on the porous Si layers 32; 34 and 35, second substrates; and 36, oxidized porous Si layers.

The first Si single-crystal substrate 31 can be reused again as a first Si single-crystal substrate 31 or as a second substrate 34 (or 35) after residual porous Si is removed or, if the surface is too rough after the surface is flattened.

The support substrates 34, 35 do not have to be identical.

The non-porous thin-films 33 on the both surfaces do not have to be identical.

EXAMPLES

Examples of the present invention will be described.

Example 1

Prepared was a p-type or n-type 6-inch-diameter first (100) single-crystal Si substrate having the thickness of 625 $\mu$m and the specific resistance of 0.01 $\Omega$.cm, and it was subjected to anodization in HF solution. The conditions for the anodization were as follows:

Current density: 7 ($mA.cm^{-2}$)
Anodization solution: $HF:H_2O:C_2H_5OH=1:1:1$
Time: 11 (min)
Thickness of porous Si: 12 ($\mu$m)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 µm on porous Si by the CVD (Chemical Vapor Deposition) process. The growth conditions were as follows:

Source gas: $SiH_2Cl_2/H_2$
Gas flow rate: 0.5/180 l/min
Gas pressure: 80 Torr
Temperature: 950° C.
Growth rate: 0.3 µm/min #

Further, $SiO_2$ layer of 100 nm was formed over the surface of this epitaxial Si layer by thermal oxidation.

The surface of this $SiO_2$ layer was laid on and made to contact a surface of a Si substrate (second substrate) with an $SiO_2$ layer of 500 nm formed thereover, separately prepared. After contact of the surfaces, the $SiO_2$ layer of 100 nm and the epitaxial Si layer were removed by etching on the side surface of the bonding wafer, which exposed the edge of porous Si.

The bonding wafer was pyro-oxidized at 1000° C., and it was divided perfectly in the porous Si layer into two substrates after one hour. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in a mixture solution of 49% hydrofluoric acid and 30% hydrogen peroxide solution. Single-crystal Si remained without being etched, and with the single-crystal Si as a material of etch stop, the porous Si and oxidized porous Si layer were selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 µm on the Si oxide film. Film thicknesses of the single-crystal Si layer thus formed were measured at 100 points across the entire surface, and uniformity of film thickness was 101nm±3 nm.

Further, it was annealed at 1100° C. in hydrogen for one hour. Surface roughness was evaluated with an atomic force microscope and the root mean square roughness in a region 50 µm square was approximately 0.2 nm, which was equivalent to those of Si wafers commercially available.

Observation of cross section with a transmission electron microscope resulted in confirming that no new crystal defects were introduced into the Si layer and that good crystallinity was maintained.

The present example showed an example in which the oxide film was formed in the surface of the epitaxial Si layer and in which the oxide film was also formed in the surface of the second substrate (i.e., the oxide film was formed in the both substrates), but the same results were attained in the cases wherein the oxide film was provided in either one substrate and wherein the oxide film was not provided in either substrate. However, as discussed previously, formation of the oxide film over the outermost layer of the epitaxial Si layer is preferable from the point that the interface state of the bonding interface is able to be separated away from the active layer.

In fact, it was also the case in the subsequent embodiments that the same results were attained in any cases wherein the oxide film was formed in the both substrates, wherein the oxide film was formed in either one of the substrates, and wherein the oxide film was not formed in either substrate. Then, it is also the case that formation of the oxide film over the outermost layer of non-porous thin film (epitaxial Si layer) is preferable from the point that the interface state of the bonding interface can be separated away from the active layer.

Example 2

Prepared was a p-type or n-type 6-inch-diameter first (100) single-crystal Si substrate having the thickness of 625 µm and the specific resistance of 10 Ω.cm, and $SiO_2$ layer of 100 nm was formed over the surface thereof by thermal oxidation. Hydrogen ions were implanted in $1\times10^{17}/cm^2$ into the principal surface with the acceleration voltage of 50 keV applied. This resulted in forming a porous structure in the depth of near 0.5 µm below the surface by hydrogen bubbles.

The surface of this $SiO_2$ layer was laid on and made to contact with a surface of Si substrate (second substrate) with $SiO_2$ layer of 500 nm formed thereover, separately prepared. After contact of the surfaces, the $SiO_2$ layer of 100 nm and the non-porous Si layer were removed by etching on the side surface of the bonding wafer, which exposed the edge of porous Si.

The bonding wafer was pyro-oxidized at 1000° C., and it was divided perfectly in the porous Si layer into two substrates after one hour. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer were selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.5 µm on the Si oxide film. Film thicknesses of the single-crystal Si layer thus formed were measured at 100 points across the entire surface, and uniformity of film thickness was within ±3%.

Further, it was annealed at 1100° C. in hydrogen for one hour. Surface roughness was evaluated with the atomic force microscope and the root mean square roughness in a region 50 µm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

Example 3

Prepared was a p-type or n-type 6-inch-diameter first (100) single-crystal Si substrate having the thickness of 625

μm and the specific resistance of 0.01 Ω.cm, and it was subjected to anodization in HF solution. The conditions for the anodization were as follows.

Current density: 7 (mA.cm$^{-2}$)
Anodization solution: HF:H$_2$O:C$_2$H$_5$OH=1:1:1
Time: 11 (min)
Thickness of porous Si: 12 (μm)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 μm on porous Si by the CVD (Chemical Vapor Deposition) process. The growth conditions were as follows:

Source gas: SiH$_2$Cl$_2$/H$_2$
Gas flow rate: 0.5/180 l/min
Gas pressure: 80 Torr
Temperature: 950° C.
Growth rate: 0.3 μm/min Further, a SiO$_2$ layer of 100 nm was formed over the surface of this epitaxial Si layer by thermal oxidation.

Then hydrogen ions were implanted in 1×10$^{16}$/cm$^2$ into the principal surface with the acceleration voltage of 180 keV applied.

The surface of this SiO$_2$ layer was laid on and made to contact a surface of a Si substrate (second substrate) with a SiO$_2$ layer of 500 nm formed thereover, separately prepared. After contact of the surfaces, the SiO$_2$ layer of 100 nm and the epitaxial Si layer were removed by etching on the side surface of the bonding wafer, which exposed the edge of porous Si.

The bonding wafer was pyro-oxidized at 1000° C., and it was divided perfectly into two substrates at a position corresponding to the projected range of hydrogen ion implantation in the porous Si layer after one hour. The separated surfaces were observed, showing that the central portion was found to remain almost in its original state while porous Si of the wafer side surface was changed to SiO$_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even 10$^5$ or more. Therefore, a decrease in film thickness of the non-porous layer was so small that the etch amount thereof was negligible (about several ten angstroms).

Namely, the single-crystal Si layer was formed in the thickness of 0.1 μm on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with the atomic force microscope and the root mean square roughness in a region 50 μm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

Example 4

Prepared was a p-type or n-type 6-inch-diameter first (100) single-crystal Si substrate having the thickness of 625 μm and the specific resistance of 0.01 Ω.cm, and it was subjected to anodization in HF solution. The conditions for the anodization were as follows:

Current density: 7 (mA.cm$^{-2}$)
Anodization solution: HF:H$_2$O:C$_2$H$_5$OH=1:1:1
Time: 3 (min)
Thickness of porous Si: 3 (μm)
Porosity: 15 (%)

Further,
Current density: 30 (mA.cm$^{-2}$)
Anodization solution: HF:H$_2$O:C$_2$H$_5$OH=1:1:1
Time: 3 (min)
Thickness of porous Si: 10 (μm)
Porosity: 45 (%)

Further,
Current density: 7 (mA.cm$^{-2}$)
Anodization solution: HF:H$_2$O:C$_2$H$_5$OH=1:1:1
Time: 3 (min)
Thickness of porous Si: 3 (μm)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 μm on porous Si by the CVD (Chemical Vapor Deposition) process. The growth conditions were as follows.

Source gas: SiH$_2$Cl$_2$/H$_2$
Gas flow rate: 0.5/180 l/min
Gas pressure: 80 Torr
Temperature: 950° C.
Growth rate: 0.3 μm/min Further, a SiO$_2$ layer of 100 nm was formed over the surface of this epitaxial Si layer by thermal oxidation.

The surface of this SiO$_2$ layer was laid on and made to contact a surface of a Si substrate (second substrate) with a SiO$_2$ layer of 500 nm formed thereover, separately prepared. After contact of the surfaces, the SiO$_2$ layer of 100 nm and the epitaxial Si layer were removed by etching on the side surface of the bonding wafer, which exposed the edge of porous Si.

The bonding wafer was pyro-oxidized at 1000° C., and it was divided perfectly in the porous Si layer into two substrates after one hour. The portion with the higher porosity was structurally fragile, so that division started from that fragile portion. The separated surfaces were observed, showing that the central portion was found to remain almost in its original state while porous Si of the wafer side surface was changed to SiO$_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even 10$^5$ or more. Therefore, a decrease in film thickness of the non-porous layer was so small that the etch amount thereof was negligible (about several ten angstroms).

Namely, the single-crystal Si layer was formed in the thickness of 0.1 μm on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with the atomic force microscope and the root mean square roughness in a region 50 μm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

Example 5

Prepared was a p-type or n-type 6-inch-diameter first (100) single-crystal Si substrate having the thickness of 625 μm and the specific resistance of 0.01 Ω.cm, and it was subjected to anodization in HF solution. The conditions for the anodization were as follows:

Current density: 7 (mA.cm$^{-2}$)

Anodization solution: $HF:H_2O:C_2H_5OH=1:1:1$

Time: 11 (min)

Thickness of porous Si: 12 (μm)

Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 μm on porous Si by the CVD (Chemical Vapor Deposition) process. The growth conditions were as follows:

Source gas: $SiH_2Cl_2/H_2$

Gas flow rate: 0.5/180 l/min

Gas pressure: 80 Torr

Temperature: 950° C.

Growth rate: 0.3 μm/min

Further, a $SiO_2$ layer of 100 nm was formed over the surface of this epitaxial Si layer by thermal oxidation.

The surface of this $SiO_2$ layer was laid on and made to contact a surface of a Si substrate (second substrate) with a $SiO_2$ layer of 500 nm formed thereover, separately prepared. After contact of the surfaces, the $SiO_2$ layer of 100 nm and the epitaxial Si layer were removed by etching on the side surface of the bonding wafer, which exposed the edge of porous Si.

The bonding wafer was pyro-oxidized at 1000° C., and it was divided perfectly in the porous Si layer into two substrates after one hour. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 μm on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with the atomic force microscope and the root mean square roughness in a region 50 μm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. Thus, the first substrate of single-crystal Si was able to be put again into the porous layer forming step.

Example 6

Prepared was a p-type or n-type 6-inch-diameter first (100) single-crystal Si substrate having the thickness of 625 μm and the specific resistance of 0.01 Ω.cm, and it was subjected to anodization in HF solution. The conditions for the anodization were as follows:

Current density: 7 (mA.cm$^{-2}$)

Anodization solution: $HF:H_2O:C_2H_5OH=1:1:1$

Time: 11 (min)

Thickness of porous Si: 12 (μm)

Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 μm on porous Si by the CVD (Chemical Vapor Deposition) process. The growth conditions were as follows:

Source gas: $SiH_2Cl_2/H_2$

Gas flow rate: 0.5/180 l/min

Gas pressure: 80 Torr

Temperature: 950° C.

Growth rate: 0.3 μm/min

Further, a $SiO_2$ layer of 100 nm was formed over the surface of this epitaxial Si layer by thermal oxidation.

Hydrogen ions were implanted in $1\times10^{16}/cm^2$ in a region of the principal surface except for the peripheral 10 mm of wafer with the acceleration voltage of 150 keV applied. This implantation of hydrogen ions can realize a low porosity for the peripheral portion and a high porosity for the central portion, whereby in the oxidation process, the volume expansion of the peripheral portion becomes greater. Therefore, the central portion becomes weaker in strength and is thus easy to peel.

The surface of this $SiO_2$ layer was laid on and made to contact a surface of a Si substrate (second substrate) with a $SiO_2$ layer of 500 nm formed thereover, separately prepared. After contact of the surfaces, the $SiO_2$ layer of 100 nm and the epitaxial Si layer were removed by etching on the side surface of the bonding wafer, which exposed the edge of porous Si.

The bonding wafer was pyro-oxidized at 1000° C., and it was divided perfectly into two substrates at a position corresponding to the projected range of hydrogen ion implantation in the porous Si layer after 0.7 hour. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 $\mu$m on the Si oxide film. Film thicknesses of the single-crystal Si layer thus formed were measured at 100 points across the entire surface, and uniformity of film thickness was 101 nm±3nm.

Further, it was annealed at 1100° C. in hydrogen for one hour. Surface roughness was evaluated with the atomic force microscope and the root mean square roughness in a region 50 $\mu$m square was approximately 0.2 nm, which was equivalent to those of Si wafers commercially available.

Observation of cross section with the transmission electron microscope resulted in confirming that no new crystal defects were introduced into the Si layer and that good crystallinity was maintained.

Example 7

Prepared was a p-type or n-type 6-inch-diameter first (100) single-crystal Si substrate having the thickness of 625 $\mu$m and the specific resistance of 0.01 $\Omega$.cm, and it was subjected to anodization in HF solution. The conditions for the anodization were as follows:

Current density: 7 ($mA.cm^{-2}$)
Anodization solution: $HF:H_2O:C_2H_5OH=1:1:1$
Time: 11 (min)
Thickness of porous Si: 12 ($\mu$m)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 $\mu$m on porous Si by the CVD (Chemical Vapor Deposition) process. The growth conditions were as follows:

Source gas: $SiH_2Cl_2/H_2$
Gas flow rate: 0.5/180 l/min
Gas pressure: 80 Torr
Temperature: 950° C.
Growth rate: 0.3 $\mu$m/min Further, a $SiO_2$ layer of 100 nm was formed over the surface of this epitaxial Si layer by thermal oxidation.

The surface of this $SiO_2$ layer was laid on and made to contact a surface of a-Si substrate (second substrate) with a $SiO_2$ layer of 500 nm formed thereover, separately prepared, after they were exposed to an oxygen plasma. After contact of the surfaces, the $SiO_2$ layer of 100 nm and the epitaxial Si layer were removed by etching on the side surface of the bonding wafer, which exposed the edge of porous Si. The oxygen plasma process can enhance the bonding strength, and if they are further heated at 300° C. for about one hour after exposed to the oxygen plasma, superimposed on each other, and contacted with each other, the bonding strength becomes much higher.

The bonding wafer was pyro-oxidized at 1100° C., and it was divided perfectly in the porous Si layer into two substrates after 0.7 hour. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 $\mu$m on the Si oxide film. Film thicknesses of the single-crystal Si layer thus formed were measured at 100 points across the entire surface, and uniformity of film thickness was 101 nm±3nm.

Further, it was annealed at 1100° C. in hydrogen for one hour. Surface roughness was evaluated with the atomic force microscope and the root mean square roughness in a region 50 $\mu$m square was approximately 0.2 nm, which was equivalent to those of Si wafers commercially available.

Observation of cross section with the transmission electron microscope resulted in confirming that no new crystal defects were introduced into the Si layer and that good crystallinity was maintained.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. Thus, the first substrate of single-crystal Si was able to be put again into the porous layer forming step.

Example 8

Prepared was a p-type or n-type 6-inch-diameter first (100) single-crystal Si substrate having the thickness of 625 $\mu$m and the specific resistance of 10 $\Omega$.cm, and a $SiO_2$ layer of 100 nm was formed over the surface thereof by thermal oxidation. Hydrogen ions were implanted in $1\times10^{17}/cm^2$ into the principal surface with the acceleration voltage of 25 keV applied. This resulted in forming a porous structure in the depth of near 0.3 $\mu$m below the surface by hydrogen bubbles.

The surface of this $SiO_2$ layer was laid on and made to contact a surface of a Si substrate (second substrate) with a $SiO_2$ layer of 500 nm formed thereover, separately prepared, after they were exposed to a nitrogen plasma. After contact of the surfaces, the $SiO_2$ layer of 100 nm and the non-porous Si layer were removed by etching on the side surface of the bonding wafer, which exposed the edge of porous Si. The nitrogen plasma process can enhance the bonding strength, and if they are further heated at 300° C. for about one hour after exposed to the nitrogen plasma, superimposed on each other, and contacted with each other, the bonding strength becomes much higher.

The bonding wafer was dry-oxidized at 1100° C., and it was divided perfectly in the porous Si layer into two substrates after two hours. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.2 $\mu$m on the Si oxide film. Film thicknesses of the single-crystal Si layer thus formed were measured at 100 points across the entire surface, and uniformity of film thickness was within ±3%.

Further, it was annealed at 1100° C. in hydrogen for one hour. Surface roughness was evaluated with the atomic force microscope and the root mean square roughness in a region 50 $\mu$m square was approximately 0.2 nm, which was equivalent to those of Si wafers commercially available.

Observation of cross section with the transmission electron microscope resulted in confirming that no new crystal defects were introduced into the Si layer and that good crystallinity was maintained.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. Thus, the first substrate of single-crystal Si was able to be put again into the porous layer forming step.

Example 9

Prepared was a p-type or n-type 6-inch-diameter first (100) single-crystal Si substrate having the thickness of 625 $\mu$m and the specific resistance of 0.01 $\Omega$.cm, and it was subjected to anodization in HF solution. The conditions for the anodization were as follows:

Current density: 7 (mA.cm$^{-2}$)

Anodization solution: $HF:H_2O:C_2H_5OH=1:1:1$

Time: 11 (min)

Thickness of porous Si: 12 ($\mu$m)

Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 $\mu$m on porous Si by the CVD (Chemical Vapor Deposition) process. The growth conditions were as follows:

Source gas: $SiH_2Cl_2/H_2$

Gas flow rate: 0.5/180 l/min

Gas pressure: 80 Torr

Temperature: 950° C.

Growth rate: 0.3 $\mu$m/min

Further, a $SiO_2$ layer of 100 nm was formed over the surface of this epitaxial Si layer by thermal oxidation.

Hydrogen ions were implanted in $5\times10^{16}/cm^2$ into the principal surface with the acceleration voltage of 180 keV applied.

Then the $SiO_2$ layer of 100 nm and the epitaxial Si layer in the side surface were removed to expose the porous Si layer.

The surface of this $SiO_2$ layer was laid on and made to contact a surface of a Si substrate (second substrate) with a $SiO_2$ layer of 500 nm formed thereover, separately prepared, after they were exposed to a nitrogen plasma. The nitrogen plasma process can enhance the bonding strength, and if they are further heated at 300° C. for about one hour after exposed to the nitrogen plasma, superimposed on each other, and contacted with each other, the bonding strength becomes much higher.

The bonding wafer was pyro-oxidized at 900° C., and it was divided perfectly into two substrates at a position corresponding to the projected range of hydrogen ion implantation in the porous Si layer after two hours. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 $\mu$m on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with the atomic force microscope and the root mean square roughness in a region 50 $\mu$m square was approximately 0.2 nm, which was equivalent to those of Si wafers commercially available.

Observation of cross section with the transmission electron microscope resulted in confirming that no new crystal defects were introduced into the Si layer and that good crystallinity was maintained.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. Thus, the first substrate of single-crystal Si was able to be put again into the porous layer forming step.

Example 10

Prepared was a p-type or n-type 6-inch-diameter first (100) single-crystal Si substrate having the thickness of 625 $\mu$m and the specific resistance of 0.01 $\Omega$.cm, and it was subjected to both-face anodization in HF solution. The conditions for the anodization were as follows. The both-face anodization was carried out face by face for 11 minutes each.

Current density: 7 (mA.cm$^{-2}$)
Anodization solution: $HF:H_2O:C_2H_5OH=1:1:1$
Time: 11×2 (min)
Thickness of porous Si: 12 ($\mu$m)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 $\mu$m on each porous Si layer by the CVD (Chemical Vapor Deposition) process. The growth conditions were as follows:

Source gas: $SiH_2Cl_2/H_2$
Gas flow rate: 0.5/180 l/min
Gas pressure: 80 Torr
Temperature: 950° C.
Growth rate: 0.3 $\mu$m/min Further, a $SiO_2$ layer of 100 nm was formed over the surface of each epitaxial Si layer by thermal oxidation.

The surfaces of the $SiO_2$ layers were laid on and made to contact respective surfaces of two Si substrates (second substrates) with a $SiO_2$ layer of 500 nm formed thereover, separately prepared. After contact of the surfaces, the $SiO_2$ layers of 100 nm and the epitaxial Si layers were removed by etching on the side surface of the bonding wafer, which exposed the edge of porous Si.

The bonding wafer was pyro-oxidized at 1000° C., and it was divided perfectly in the porous Si layers into three substrates after one hour. The separated surfaces were observed, showing that the central portion was found to remain almost in its original state while porous Si of the wafer side surface was changed to $SiO_2$.

After that, the porous Si and oxidized porous Si layers left on the side of the two second substrates were subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layers were selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, two of the single-crystal Si layer were formed in the thickness of 0.1 $\mu$m on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with the atomic force microscope and the root mean square roughness in a region 50 $\mu$m square was approximately 0.2 nm, which was equivalent to those of Si wafers commercially available.

Observation of cross section with the transmission electron microscope resulted in confirming that no new crystal defects were introduced into the Si layer and that good crystallinity was maintained.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. Thus, the first substrate of single-crystal Si was able to be put again into the porous layer forming step.

Example 11

Prepared was a p-type or n-type 6-inch-diameter first (100) single-crystal Si substrate having the thickness of 625 $\mu$m and the specific resistance of 0.01 $\Omega$.cm, and it was subjected to anodization in HF solution. The conditions for the anodization were as follows:

Current density: 7 (mA.cm$^{-2}$)
Anodization solution: $HF:H_2O:C_2H_5OH=1:1:1$
Time: 11 (min)
Thickness of porous Si: 12 ($\mu$m)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 $\mu$m on porous Si by the CVD (Chemical Vapor Deposition) process. The growth conditions were as follows:

Source gas: $SiH_2Cl_2/H_2$
Gas flow rate: 0.5/180 l/min
Gas pressure: 80 Torr
Temperature: 950° C.
Growth rate: 0.3 $\mu$m/min Further, a $SiO_2$ layer of 100 nm was formed over the surface of this epitaxial Si layer by thermal oxidation.

Hydrogen ions were implanted in $1\times10^{16}/cm^2$ into the principal surface with the acceleration voltage of 180 keV applied.

The surface of the $SiO_2$ layer was laid on and made to contact a surface of a quartz substrate (second substrate) prepared separately, after each surface was proposed to a nitrogen plasma. After contact of the surfaces, the $SiO_2$ layer of 100 nm and the epitaxial Si layer were removed by etching on the side surface of the bonding wafer, which exposed the edge of porous Si. The nitrogen plasma process can enhance the bonding strength, and if they are further heated at 300° C. for about one hour after exposed to the nitrogen plasma, superimposed on each other, and contacted with each other, the bonding strength becomes much higher.

The bonding wafer was low-temperature-oxidized at 700° C., and it was divided perfectly into two substrates at a position corresponding to the projected range of hydrogen ion implantation in the porous Si layer after ten hours. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 $\mu$m on the Si oxide film on the quartz substrate. Film thicknesses of the single-crystal Si layer thus formed were measured at 100 points across the entire surface, and uniformity of film thickness was 101 nm±3 nm.

Observation of cross section with the transmission electron microscope resulted in confirming that no new crystal defects were introduced into the Si layer and that good crystallinity was maintained.

The same results were obtained without forming the oxide film on the surface of the epitaxial Si layer.

The same results were obtained with low-melting-point glass.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. Thus, the first substrate of single-crystal Si was able to be put again into the porous layer forming step.

Example 12

Prepared was a p-type or n-type 6-inch-diameter first (100) single-crystal Si substrate having the thickness of 625 $\mu$m and the specific resistance of 0.01 $\Omega$.cm, and it was subjected to anodization in HF solution. The conditions for the anodization were as follows:

Current density: 7 (mA.cm$^{-2}$)
Anodization solution: $HF:H_2O:C_2H_5OH=1:1:1$
Time: 11 (min)
Thickness of porous Si: 12 ($\mu$m)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 1.05 $\mu$m on porous Si by the CVD (Chemical Vapor Deposition) process. The growth conditions were as follows:

Source gas: $SiH_2Cl_2/H_2$
Gas flow rate: 0.5/180 l/min
Gas pressure: 80 Torr
Temperature: 950° C.
Growth rate: 0.3 $\mu$m/min Further, a $SiO_2$ layer of 100 nm was formed over the surface of this epitaxial Si layer by thermal oxidation.

The surface of this $SiO_2$ layer was laid on and made to contact a surface of a Si substrate (second substrate) with a $SiO_2$ layer of 500 nm formed thereover, separately prepared. After contact of the surfaces, the $SiO_2$ layer of 100 nm and the epitaxial Si layer were removed by etching on the side surface of the bonding wafer, which exposed the edge of porous Si.

The bonding wafer was pyro-oxidized at 1000° C., and it was divided perfectly in the porous Si layer into two substrates after one hour. The separated surfaces were observed, showing that the central portion was found to remain almost in its original state while porous Si of the wafer side surface was changed to $SiO_2$.

After that, the porous Si and oxidized porous Si layer left on the second substrate side was subjected to selective polishing with single-crystal Si as a polishing stopper. Single-crystal Si was left without being polished, and with the single-crystal Si as a material of polishing stop, the porous Si and oxidized porous Si layer was selectively polished to be removed perfectly.

Namely, the single-crystal Si layer was formed in the thickness of 1 $\mu$m on the Si oxide film. Film thicknesses of the single-crystal Si layer thus formed were measured at 100 points across the entire surface, and uniformity of film thickness was ±3%.

Further, it was annealed at 1100° C. in hydrogen for one hour. Surface roughness was evaluated with the atomic force microscope and the root mean square roughness in a region 50 $\mu$m square was approximately 0.2 nm, which was equivalent to those of Si wafers commercially available.

Observation of cross section with the transmission electron microscope resulted in confirming that no new crystal defects were introduced into the Si layer and that good crystallinity was maintained.

Example 13

Prepared was a p-type or n-type 6-inch-diameter first (100) single-crystal Si substrate having the thickness of 625 $\mu$m and the specific resistance of 0.01 $\Omega$.cm, and it was subjected to anodization in HF solution. The conditions for the anodization were as follows:

Current density: 7 (mA.cm$^{-2}$)
Anodization solution: $HF:H_2O:C_2H_5OH=1:1:1$
Time: 11 (min)
Thickness of porous Si: 12 ($\mu$m)
Porosity: 15 (%)

This substrate was oxidized at 400° C. in an oxygen atmosphere for one hour. This oxidation caused a thermally oxidized film to cover the internal walls of pores of porous Si. Single-crystal GaAs was epitaxially grown in the thickness of 1 $\mu$m on porous Si by the MOCVD (Metal Organic Chemical Vapor Deposition) process. The growth conditions were as follows:

Source gas: $TMG/AsH_3/H_2$
Gas pressure: 80 Torr
Temperature: 700° C.

The surface of the GaAs layer was laid on and made to contact a surface of a Si substrate (second substrate) prepared separately and thereafter the epitaxial layer on the side surface of the bonding wafer was removed by etching, thereby exposing the edge of porous Si.

The bonding wafer was pyro-oxidized at 1000° C., and it was divided perfectly in the porous Si layer into two substrates after one hour. The separated surfaces were observed, showing that the central portion was found to remain almost in its original state while porous Si of the wafer side surface was changed to $SiO_2$.

After that, the porous Si and oxidized porous Si layer left on the second substrate side was subjected to etching with ethylenediamine+pyrocatechol+water (at a ratio of 17 ml:3 g:8 ml) at 110° C., after removing oxidized Si with HF. Single-crystal GaAs was left without being etched, and with the single-crystal GaAs as a material of etch stop, the porous Si and oxidized porous Si layer was selectively etched to be removed completely.

The etch rate of non-porous GaAs single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal GaAs layer was formed in the thickness of 1 μm on Si.

Observation of cross section with the transmission electron microscope resulted in confirming that no new crystal defects were introduced into the GaAs layer and that good crystallinity was maintained.

Using an Si substrate with an oxide film as a support substrate, GaAs on the insulating film was also able to be fabricated in the same manner.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. Thus, the first substrate of single-crystal Si was able to be put again into the porous layer forming step.

Example 14

Prepared was a p-type or n-type 6-inch-diameter first (100) single-crystal Si substrate having the thickness of 625 μm and the specific resistance of 0.01 Ω.cm, and it was subjected to anodization in HF solution. The conditions for the anodization were as follows:

Current density: 7 ($mA.cm^{-2}$)
Anodization solution: $HF:H_2O:C_2H_5OH=1:1:1$
Time: 11 (min)
Thickness of porous Si: 12 (μm)
Porosity: 15 (%)

This substrate was oxidized at 400° C. in an oxygen atmosphere for one hour. This oxidation caused a thermally oxidized film to cover the internal walls of pores of porous Si. Single-crystal AlGaAs was epitaxially grown in the thickness of 0.5 μm on porous Si by the MBE (Molecular Beam Epitaxy) process.

The surface of the AlGaAs layer was laid on and made to contact with a surface of a glass substrate (second substrate) prepared separately and thereafter the epitaxial layer on the side surface of the bonding wafer was removed by etching, thereby exposing the edge of porous Si.

The bonding wafer was low-temperature-oxidized at 700° C., and it was divided perfectly in the porous Si layer into two substrates after ten hours. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal AlGaAs remained without being etched, and with the single-crystal AlGaAs as a material of etch stop, the porous Si and oxidized porous Si layer was selectively etched to be removed completely.

The etch rate of non-porous AlGaAs single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal AlGaAs layer having the thickness of 0.5 μm was formed on the glass substrate.

Observation of cross section with the transmission electron microscope resulted in confirming that no new crystal defects were introduced into the AlGaAs layer and that good crystallinity was maintained.

After removing the residual porous Si and oxidized porous Si layer, the surface of the first Si single-crystal substrate was polished into a mirror surface and thereafter the first substrate was again used as a first Si single-crystal substrate.

Example 15

Prepared was a p-type or n-type 6-inch-diameter first (100) single-crystal Si substrate having the thickness of 625 μm and the specific resistance of 0.01 Ω.cm, and it was subjected to anodization in HF solution. The conditions for the anodization were as follows:

Current density: 7 ($mA.cm^{-2}$)
Anodization solution: $HF:H_2O:C_2H_5OH=1:1:1$
Ad Time: 11 (min)
Thickness of porous Si: 12 (μm)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 μm on porous Si by the CVD (Chemical Vapor Deposition) process. The growth conditions were as follows:

Source gas: $SiH_2Cl_2/H_2$
Gas flow rate: 0.5/180 l/min
Gas pressure: 80 Torr
Temperature: 950° C.
Growth rate: 0.3 μm/min Further, a $SiO_2$ layer of 100 nm was formed over the surface of this epitaxial Si layer by thermal oxidation.

The surface of the $SiO_2$ layer was laid on and made to contact a surface of a Si substrate (second substrate) with a $SiO_2$ layer of 500 nm formed thereover, prepared separately.

$Si_3N_4$ was deposited in the thickness of 0.5 μm at a low temperature on both outer surfaces of the bonding wafer and thereafter the $Si_3N_4$ layer of 0.5 μm and the $SiO_2$ layer of 100 nm and the epitaxial Si layer on the side surface of the bonding wafer were removed by etching, thereby exposing the edge of porous Si. When $Si_3N_4$ is formed in this manner, because Si is easier to expand than $Si_3N_4$, stress acts in the wafer peeling directions in the peripheral region of wafer, which facilitates occurrence of the wedge effect by oxidation.

The bonding wafer was pyro-oxidized at 1000° C., and it was divided perfectly in the porous Si layer into two substrates after 0.8 hour. The separated surfaces were observed, showing that the central portion was found to remain almost in its original state while porous Si of the wafer side surface was changed to $SiO_2$. The $Si_3N_4$ layer on the back surface may or may not be removed.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 μm on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with an atomic force microscope and the root mean square roughness in a region 50 μm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. Thus, the first substrate of single-crystal Si was able to be put again into the porous layer forming step.

Example 16

Prepared was a p-type or n-type 6-inch-diameter first (100) single-crystal Si substrate having the thickness of 625 μm and the specific resistance of 0.01 Ωcm, and it was subjected to anodization in HF solution. The conditions for the anodization were as follows:

Current density: 7 (mA.cm$^{-2}$)

Anodization solution: HF:H$_2$O:C$_2$H$_5$OH=1:1:1

Time: 11 (min)

Thickness of porous Si: 12 (μm)

Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 μm on porous Si by the CVD (Chemical Vapor Deposition) process. The growth conditions were as follows:

Source gas: SiH$_2$Cl$_2$/H$_2$

Gas flow rate: 0.5/180 l/min

Gas pressure: 80 Torr

Temperature: 950° C.

Growth rate: 0.3 μm/min

Further, a SiO$_2$ layer of 100 nm was formed over the surface of this epitaxial Si layer by thermal oxidation.

The surface of this SiO$_2$ layer was laid on and made to contact a surface of a Si substrate (second substrate) with a SiO$_2$ layer of 500 nm formed thereover, separately prepared. After contact of the surfaces, the SiO$_2$ layer of 100 nm and the epitaxial Si layer were removed by etching on the side surface of the bonding wafer, which exposed the edge of porous Si.

The bonding wafer was pyro-oxidized at 1000° C., and it was divided perfectly in the porous Si layer into two substrates after one hour. The separated surfaces were observed, showing that the central portion was found to remain almost in its original state while porous Si of the wafer side surface was changed to SiO$_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 μm on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with an atomic force microscope and the root mean square roughness in a region 50 μm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. After being polished, the first substrate was able to be put into the process as a second substrate this time.

Example 17

Prepared was a p-type or n-type 6-inch-diameter first (100) single-crystal Si substrate having the thickness of 625 μm and the specific resistance of 0.01 Ω.cm, and it was subjected to both-face anodization in HF solution. The conditions for the anodization were as follows: The both-face anodization was carried out face by face for 11 minutes each.

Current density: 7 (mA.cm$^{-2}$)

Anodization solution: HF:H$_2$O:C$_2$H$_5$OH=1:1:1

Time: 11×2 (min)

Thickness of porous Si: 12 (μm)

Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 µm on each porous Si layer by the CVD (Chemical Vapor Deposition) process. The growth conditions were as follows:

Source gas: $SiH_2Cl_2/H$.
Gas flow rate: 0.5/180 l/min
Gas pressure: 80 Torr
Temperature: 950° C.
Growth rate: 0.3 µm/min Further, a $SiO_2$ layer of 100 nm was formed over the surface of each epitaxial Si layer by thermal oxidation.

The surfaces of the $SiO_2$ layers were laid on and made to contact respective surfaces of two Si substrates (second substrates) with a $SiO_2$ layer of 500 nm formed thereover, separately prepared. After contact of the surfaces, the $SiO_2$ layers of 100 nm and the epitaxial Si layers were removed by etching on the side surface of the bonding wafer, which exposed the edge of porous Si.

The bonding wafer was pyro-oxidized at 1000° C., and it was divided perfectly in the porous Si layers into three substrates after one hour. The separated surfaces were observed, showing that the central portion was found to remain almost in its original state while porous Si of the wafer side surface was changed to $SiO_2$.

After that, the porous Si and oxidized porous Si layers left on the side of the two second substrates were subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layers were selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 µm on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with the atomic force microscope and the root mean square roughness in a region 50 µm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

At the same time, the porous Si and oxidized porous Si layer left on the first substrate side was also subjected thereafter to selective etching with agitation in the mixture solution of 49% hydrofluoric acid and 30% hydrogen peroxide solution. Single-crystal Si was left without being etched, and with the single-crystal Si as a material of etch stop, the porous Si and oxidized porous Si layer was selectively etched to be removed completely. After being polished, the first substrate was able to be put into the process as one of the second substrates this time.

Example 18

Prepared was a p-type or n-type 6-inch-diameter first (100) single-crystal Si substrate having the thickness of 625 µm and the specific resistance of 10 Ω.cm, and $SiO_2$ layer of 100 nm was formed over the surface thereof by thermal oxidation. Helium ions were implanted in $1\times10^{17}/cm^2$ into the principal surface with the acceleration voltage of 100 keV applied. This resulted in forming a porous structure in the depth of near 0.5 µm below the surface by helium bubbles.

The surface of this $SiO_2$ layer was laid on and made to contact a surface of a Si substrate (second substrate) with a $SiO_2$ layer of 500 nm formed thereover, separately prepared. After contact of the surfaces, the $SiO_2$ layer of 100 nm and the non-porous Si layer were removed by etching on the side surface of the bonding wafer, which exposed the edge of porous Si.

The bonding wafer was pyro-oxidized at 1000° C., and it was divided perfectly in the porous Si layer into two substrates after one hour. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.5 µm on the Si oxide film. Film thicknesses of the single-crystal Si layer thus formed were measured at 100 points across the entire surface, and uniformity of film thickness was within ±3%.

Further, it was annealed at 1100° C. in hydrogen for one hour. Surface roughness was evaluated with the atomic force microscope and the root mean square roughness in a region 50 µm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

Example 19

Prepared was a p-type or n-type 6-inch-diameter first (100) single-crystal Si substrate having the thickness of 625 µm and the specific resistance of 0.01 Ω.cm, and it was subjected to anodization in HF solution. The conditions for the anodization were as follows:

Current density: 7 ($mA.cm^{-2}$)
Anodization solution: $HF:H_2O:C_2H_5OH=1:1:1$
Time: 11 (min)
Thickness of porous Si: 12 (µm)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 µm on porous Si by the CVD (Chemical Vapor Deposition) process. The growth conditions were as follows:

Source gas: $SiH_2Cl_2/H_2$
Gas flow rate: 0.5/180 l/min
Gas pressure: 80 Torr
Temperature: 950° C.
Growth rate: 0.3 μm/min Further, a $SiO_2$ layer of 100 nm was formed over the surface of this epitaxial Si layer by thermal oxidation.

The surface of the $SiO_2$ layer was laid on and made to contact a surface of a Si substrate (second substrate) with a $SiO_2$ layer of 500 nm formed thereover, prepared separately, and thereafter a pulse voltage of ±500 V and cycles of 100 msec was applied thereto to enhance the bonding strength more. Further, the $SiO_2$ layer of 100 nm and the epitaxial Si layer on the side surface of the bonding wafer were removed by etching, thereby exposing the edge of porous Si.

The bonding wafer was pyro-oxidized at 1000° C., and it was divided perfectly in the porous Si layer into two substrates after one hour. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 μm on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with the atomic force microscope and the root mean square roughness in a region 50 μm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

Example 20

Prepared was a p-type or n-type 6-inch-diameter first (100) single-crystal Si substrate having the thickness of 625 μm and the specific resistance of 0.01 Ω.cm, and it was subjected to anodization in HF solution. The conditions for the anodization were as follows:

Current density: 7 ($mA.cm^{-2}$)
Anodization solution: $HF:H_2O:C_2H_5OH=1:1:1$
Time: 11 (min)
Thickness of porous Si: 12 (μm)
Porosity: 15 (%)

This substrate was oxidized at 400° C. in an oxygen atmosphere for one hour. This oxidation caused a thermally oxidized film to cover the internal walls of pores of porous Si. Single-crystal Si was epitaxially grown in the thickness of 0.15 μm on porous Si by the CVD (Chemical Vapor Deposition) process. The growth conditions were as follows:

Source gas: $SiH_2Cl_2/H_2$
Gas flow rate: 0.5/180 l/min
Gas pressure: 80 Torr
Temperature: 950° C.
Growth rate: 0.3 μm/min Further, a $SiO_2$ layer of 100 nm was formed over the surface of this epitaxial Si layer by thermal oxidation.

The surface of the $SiO_2$ layer was laid on and made to contact a surface of a Si substrate (second substrate) with a $SiO_2$ layer of 500 nm formed thereover, prepared separately, and thereafter a pressure of 1000 kg/$cm^2$ was applied thereto at room temperature perpendicularly to the bonding substrate to enhance the bonding strength more. Further, the $SiO_2$ layer of 100 nm and the epitaxial Si layer on the side surface of the bonding wafer were removed by etching, thereby exposing the edge of porous Si.

The bonding wafer was pyro-oxidized at 1000° C., and it was divided perfectly in the porous Si layer into two substrates after one hour. The separated surfaces were observed, showing that the central portion was found to remain almost in its original state while porous Si of the wafer side surface was changed to $SiO_2$.

After that, the porous Si and oxidized porous Si layer remaining on the second substrate side was subjected to selective etching with agitation in the mixture solution of 49% hydrofluoric acid and 30% hydrogen peroxide solution. Single-crystal Si remained without being etched, and with the single-crystal Si as a material of etch stop, the porous Si and oxidized porous Si layer was selectively etched to be removed completely.

The etch rate of non-porous Si single crystal by the etchant was extremely low and the selectivity of the etch rate of the porous layer thereto was even $10^5$ or more. Therefore, a decrease in film thickness of the non-porous layer was so small that the etch amount thereof was negligible (about several ten angstroms).

Namely, the single-crystal Si layer was formed in the thickness of 0.1 μm on the Si oxide film. Film thicknesses of the single-crystal Si layer thus formed were measured at 100 points across the entire surface, and uniformity of film thickness was 101 nm±3 nm.

Further, it was annealed at 1100° C. in hydrogen for one hour. Surface roughness was evaluated with the atomic force microscope and the root mean square roughness in a region 50 μm square was approximately 0.2 nm, which was equivalent to those of Si wafers commercially available.

Observation of cross section with the transmission electron microscope resulted in confirming that no new crystal defects were introduced into the Si layer and that good crystallinity was maintained.

In each of the examples described above, the epitaxial growth on porous Si can be carried out by various methods including the MBE process, the sputter process, the liquid phase growth process, etc. as well as the CVD process without having to be limited to the CVD process. Additionally, the selective etching solution of porous Si is not limited to the mixture solution of 49% hydrofluoric acid and 30% hydrogen peroxide, but may be a mixture solution of hydrofluoric acid and alcohol (ethyl alcohol, isopropyl alcohol, etc.), a mixture solution of buffered hydrofluoric acid and hydrogen peroxide, or a mixture solution of buffered hydrofluoric acid and alcohol. Further, porous Si can also be selectively etched with a mixture solution of hydrofluoric acid, nitric acid, and acetic acid because of its enormous surface area. Mixture ratios of the mixture solutions may be set arbitrarily and properly.

The other steps can also be carried out under various conditions without having to be limited to the conditions described in the above examples.

What is claimed is:

1. A fabrication process for a semiconductor film comprising:
    a step of preparing a first substrate having at least one layer of non-porous thin film on a porous Si layer;
    a step of forming a bonding substrate by bonding said first substrate to a second substrate such that said non-porous thin film is located in an inside of a laminate comprised of these substrates;
    a step of exposing said porous Si layer in a side surface of said bonding substrate comprised of said first substrate and said second substrate;
    a step of dividing said bonding substrate in said porous Si layer by oxidizing said bonding substrate; and
    a step of removing a porous Si and oxidized porous Si layer on said second substrate separated by the division of said bonding substrate in said porous Si layer.

2. A fabrication process for a semiconductor film comprising:
    a step of preparing a first substrate having at least one layer of non-porous thin film on a porous Si layer;
    a step of forming a bonding substrate by bonding said first substrate to a second substrate such that said non-porous thin film is located in an inside of a laminate comprised of these substrates in which said porous Si layer is exposed in a side surface thereof;
    a step of dividing said bonding substrate in said porous Si layer by oxidizing a bonding substrate comprised of said first substrate and said second substrate; and
    a step of removing a porous Si and oxidized porous Si layer on said second substrate separated by the division of said bonding substrate in said porous Si layer.

3. A fabrication process for a semiconductor film comprising:
    a step of preparing a first substrate having at least one layer of non-porous thin film on a separating layer;
    a step of forming a bonding substrate by bonding said first substrate to a second substrate such that said non-porous thin film is located in an inside of a laminate comprised of these substrates;
    a step of separating said non-porous thin film from said bonding substrate by oxidizing said bonding substrate; and
    a step of removing the separating and oxidized separating layer on said second substrate separated by the division of said bonding substrate in said separating layer.

4. A fabrication process for a semiconductor film comprising:
    a step of preparing a first substrate having at least one layer of non-porous thin film on a separating layer;
    a step of forming a bonding substrate by bonding said first substrate to a second substrate such that said non-porous thin film is located in an inside of a laminate comprised of these substrates;
    a step of exposing said separating layer in a side surface of said bonding substrate comprised of said first substrate and said second substrate; and
    a step of separating said non-porous thin film from said bonding substrate by oxidizing said bonding substrate.

5. A fabrication process for a semiconductor film comprising:
    a step of preparing a first substrate having at least one layer of non-porous thin film on a separating layer;
    a step of forming a bonding substrate by bonding said first substrate to a second substrate such that said non-porous thin film is located in an inside of a laminate comprised of these substrates; and
    a step of separating said non-porous thin film from said bonding substrate comprising oxidizing said bonding substrate.

6. The fabrication process of semiconductor film according to claims 1, 2, 3, 4 or 5, wherein after removing the porous Si and oxidized porous Si layer on the first substrate separated by said division of the porous Si layer, the first substrate is again used as a raw material for said first substrate before bonding.

7. The fabrication process of semiconductor film according to claims 1, 2, 3, 4 or 5, wherein after removing the porous Si and oxidized porous Si layer on the first substrate separated by said division of the porous Si layer, the first substrate is again used as a raw material for said second substrate before bonding.

8. The fabrication process of semiconductor film according to claims 1, 2, 3, 4 or 5, wherein at least one layer of non-porous thin film is formed through a porous Si layer on each of two principal surfaces of said first substrate and said second substrate is bonded to each of said two principal surfaces.

9. The fabrication process semiconductor film according to claims 1, 2, 3, 4 or 5, wherein said non-porous thin film is a single-crystal Si layer.

10. The fabrication process of semiconductor film according to claims 1, 2, 3, 4 or 5, wherein said non-porous thin film comprises an oxidized Si layer and a single-crystal Si layer.

11. The fabrication process of semiconductor film according to claims 1, 2, 3, 4 or 5, wherein said non-porous thin film is a single-crystal compound semiconductor layer.

12. The fabrication process of semiconductor film according to claims 1, 2, 3, 4 or 5, wherein said second substrate is an Si substrate.

13. The fabrication process of semiconductor film according to claims 1, 2, 3, 4 or 5, wherein said second substrate is an Si substrate in which an oxidized Si film is formed at least on a principal surface to be bonded.

14. The fabrication process of semiconductor film according to claims 1, 2, 3, 4 or 5, wherein said second substrate is a light transparent substrate.

15. The fabrication process of semiconductor film according to claim 8, wherein said second substrates respectively bonded to the two principal surfaces of said first substrate are those selected from Si substrate, Si substrate with an oxidized Si film formed at least on a principal surface to be bonded, and light transparent substrate.

16. The fabrication process of semiconductor film according to claim 15, wherein the second substrate bonded to one principal surface of said first substrate and the second substrate bonded to the other principal surface thereof are made of respective materials different from each other.

17. The fabrication process of semiconductor film according to claims 1, 2, 3, 4 or 5, wherein a surface flattening process in a direction spreaded with the principal surface of the second substrate is carried out after removing said porous Si and oxidized porous Si layer.

18. The fabrication process of semiconductor film according to claim 17, wherein said surface flattening process is annealing in an ambient containing hydrogen.

19. The fabrication process of semiconductor film according to claims 1, 2, 3, 4 or 5, wherein removal of said porous Si and oxidized porous Si layer is selectively carried out by soak in either one of hydrofluoric acid, a mixture solution in which at least one of alcohol and hydrogen peroxide solution is added to hydrofluoric acid, buffered hydrofluoric acid, and a mixture solution in which at least one of alcohol and hydrogen peroxide solution is added to buffered hydrofluoric acid.

20. The fabrication process of semiconductor film according to claim 11, wherein removal of said porous Si and oxidized porous Si layer is carried out by selective chemical etching of porous Si with an etchant having a faster etch rate of porous Si against a compound semiconductor.

21. The fabrication process of semiconductor film according to claims 1, 2, 3, 4 or 5, wherein removal of said porous Si and oxidized porous Si layer is carried out by polishing the layer, using said non-porous thin film as a stopper.

22. The fabrication process of semiconductor film according to claims 1, 2, 3, 4 or 5, wherein bonding of said first substrate to said second substrate is making the substrates into close contact with each other.

23. The fabrication process of semiconductor film according to claims 1, 2, 3, 4 or 5, wherein bonding of said first substrate to said second substrate is carried out by a method selected from anodic bonding, pressing, annealing, and combinations thereof.

24. The fabrication process of semiconductor film according to claims 1, 2, 3, 4 or 5, wherein formation of the non-porous thin film on the porous Si layer is carried out by performing anodization of an Si substrate to form porous Si and thereafter forming a non-porous thin film on said porous Si.

25. The fabrication process of semiconductor film according to claims 1, 2, 3, 4 or 5, wherein formation of the non-porous thin film on the porous Si layer is carried out by implanting ions of at least one element of rare gases, hydrogen, and nitrogen into an Si substrate to form a porous layer in a certain depth from a surface thereof.

26. The fabrication process of semiconductor film according to claims 1, 2, 3, 4 or 5, wherein formation of the non-porous thin film on the porous Si layer is carried out by anodizing an Si substrate to form a porous Si layer, thereafter forming a non-porous thin film on said porous Si layer, and then implanting ions of at least one element of rare gases, hydrogen, and nitrogen through the non-porous thin film into said porous Si layer so as to have a projected range thereof in said porous Si layer.

27. The fabrication process of semiconductor film according to claim 24, wherein said anodization is carried out in an HF solution.

28. The fabrication process of semiconductor film according to claims 1, 2, 3, 4 or 5, wherein prior to the oxidation of said bonding substrate, a layer of a material having a smaller coefficient of thermal expansion than Si is formed on at least one of outer surfaces of said bonding substrate.

29. A fabrication process for a semiconductor film comprising:
    anodizing a surface of a single-crystal silicon substrate by changing a current density to form a porous region comprised of three porous layers,
    forming at least one layer of non-porous thin film on the porous region, and
    separating the non-porous thin film from the single-crystal silicon substrate.

30. A fabrication process for a semiconductor film according to claim 29, wherein the anodizing step comprises:
    anodizing the surface of the single-crystal silicon substrate at a first current density, then anodizing the surface at a second current density higher than the first current density, and thereafter anodizing the surface at a third current density lower than the second current density.

31. A fabrication process for a semiconductor film according to claim 29, wherein an inner surface of each pore of the porous region is coated with a thermally oxidized film prior to the step of forming the non-porous thin film on the porous region.

32. A semiconductor substrate having a non-porous thin film and a single-crystal region with a porous region comprised of three porous layers sandwiched therebetween, wherein a porosity of an intermediate porous layer among the three porous layers of the porous region is higher than a porosity of either of the other porous layers contiguous to the intermediate porous layer and a thickness of the intermediate porous layer is larger than a thickness of either of the other contiguous porous layers.

33. A bonding substrate comprised of a first substrate and a second substrate, the first substrate comprising a non-porous thin film, a single-crystal region and a porous region comprised of three porous layers sandwiched between the non-porous thin film and the single-crystal region, wherein the second substrate is bonded to the first substrate such that the non-porous thin film is sandwiched between the second substrate and the porous region, wherein a porosity of an intermediate porous layer among the three porous layers of the porous region is higher than a porosity of either of the other porous layers contiguous to the intermediate porous layer and a thickness of the intermediate porous layer is larger than a thickness of either of the other contiguous porous layers.

34. A bonding substrate according to claim 33, wherein the first substrate and the second substrate are bonded to each other through an insulating layer.

35. The fabrication process for a semiconductor film according to claims 1, 2, 3, 4 or 5, wherein said first substrate is obtained by a process comprised of:
    a step of forming a porous Si layer by anodizing a silicon substrate;
    a step of forming an oxidized film on a pore wall of the porous Si layer;
    a step of forming said non-porous thin film on said silicon substrate.

36. The fabrication process for a semiconductor film according to claims 1, 2, 3, 4 or 5, wherein said step of forming the bonding substrate is a step of bonding said substrates through an insulating layer.

37. The fabrication process for a semiconductor film according to claims 1, 2, 3, 4 or 5, wherein said step of dividing the bonding substrate in said porous Si layer is carried out by oxidizing said porous Si layer.

38. The fabrication process for a semiconductor film according to claims 1, 2, 3, 4 or 5, wherein said oxidizing is carried out by pyro-oxidizing.

39. A fabrication process for a semiconductor film according to claim 29, wherein a structure resulting from forming said non-porous thin film is bonded to a second substrate to permit said non-porous thin film to be located inside before separating said non-porous thin film from said single-crystal silicon substrate.

40. A fabrication process for a semiconductor film according to claim 39, wherein said structure is bonded to permit an insulating layer to be interposed between said structure and said second substrate.

41. A fabrication process for a semiconductor film according to claim 29, wherein an anodization solution for forming each of said three porous layers, comprises identical components in identical proportion.

42. A fabrication process for a semiconductor film according to claim 29, wherein the anodizing step comprises:

anodizing the surface of the single-crystal silicon substrate at a first current density, then anodizing the surface at a second current density higher than the first current density.

43. A fabrication process for a semiconductor film according to claims 1, 2 or 32, wherein after said removing step, said non-porous thin film is heat-treated under an atmosphere containing hydrogen.

44. A fabrication process for a semiconductor film according to claims 26, 33 or 34, wherein after said separating step, said non-porous thin film is heat-treated under an atmosphere containing hydrogen.

45. The fabrication process for a semiconductor film according to claims 32, 33 or 34, wherein said separating layer is formed by anodization of a surface of an Si substrate or by implanting hydrogen ions into a certain region of an Si substrate.

46. The fabrication process for a semiconductor film according to claim 34, wherein said separating step comprises separation at said separating layer.

47. A fabrication process for a semiconductor film comprising:

a step of preparing a first substrate having at least one layer of non-porous thin film on a separating layer;

a step of forming a bonding substrate by bonding said first substrate to a second substrate such that said nonporous thin film is located in an inside of a laminate comprised of these substrates; and a step of separating said non-porous thin film from said bonding substrate comprising heating said bonding substrate in an oxidizing atmosphere.

48. The fabrication process for a semiconductor film according to claim 47, wherein said step of preparing the first substrate is comprised of implanting hydrogen ions into a Si substrate to a certain depth from a surface of the Si substrate.

49. The fabrication process for a semiconductor film according to claim 47, wherein said separating layer is an ion-implanted layer.

50. The fabrication process for a semiconductor film according to claim 47, wherein said separating step is conducted by separating said bonding substrate at said separating layer.

51. The fabrication process for a semiconductor film according to claim 47, further comprising a step of heat-treating a part of said first substrate transferred on said second substrate in a hydrogen atmosphere after said separating step.

52. A fabrication process for a semiconductor film containing a step of separating a bonding substrate formed by bonding a first substrate having an ion-implanted layer in a certain region thereof to a second substrate at the ion-implanted layer, wherein said separating step is comprised of allowing the separation in the bonding substrate to proceed from a side face of the bonding substrate toward the center of the bonding substrate and then heat-treating a part of the first substrate transferred on the second substrate in an atmosphere containing hydrogen.

53. The fabrication process for a semiconductor film according to claim 52, wherein said first substrate is formed by implanting hydrogen ions into a Si substrate.

54. The fabrication process for a semiconductor film according to claim 52, wherein said bonding substrate has an insulating layer between said first substrate and said second substrate.

55. The fabrication process for semiconductor film according to claim 52, wherein said heat-treatment is carried out in hydrogen.

56. A fabrication process for a semiconductor film comprising:

anodizing a surface of a single-crystal silicon substrate by changing a current density to form a porous region comprised of at least two porous layers;

forming at least one layer of non-porous thin film on the porous region;

separating the non-porous thin film from the single crystal silicon substrate; and heating the non-porous thin film under an atmosphere containing hydrogen.

57. The fabrication process according to claim 56, wherein said anodizing step is carried out by changing the current density but without changing a composition of a solution used in the anodizing step.

* * * * *

UNITED STATES PATENT AND TRADEMARK OFFICE
CERTIFICATE OF CORRECTION

PATENT NO. : 6,294,478 B1
DATED : September 25, 2001
INVENTOR(S) : Kiyofumi Sakaguchi et al.

It is certified that error appears in the above-identified patent and that said Letters Patent is hereby corrected as shown below:

Title page,
Item [56], FOREIGN PATENT DOCUMENTS,
"050211128 8/1993 (JP)" should read -- 05/0211128 8/1993 (JP) --; and
"070045441 2/1995 (JP)" should read -- 07-0045441 2/1995 (JP) --.

Column 1,
Line 10, "on" should read -- on a --; and
Line 65, "expensive," should read -- expense, --.

Column 2,
Line 26, "Si" should read -- a Si --; and
Line 50, "of" should read -- of the --.

Column 4,
Line 5, "time polishing," should read -- time, --.

Column 5,
Line 11, "in the" should be deleted; and
Line 26, "of" should read -- of a --.

Column 8,
Line 66, "Si" should read -- a Si --.

Column 9,
Line 25, "Si" should read -- a Si --.

Column 12,
Line 13, "deviding," should read -- dividing --;
Line 26, "for" should read -- for a --;
Line 30, "of" should read -- of a --; and
Line 59, "oxidation" should read -- oxidation, --.

Column 14,
Line 36, "Si" (both occurrences) should read -- a Si --.

Column 16,
Line 36, "the both" should read -- both the --.

Column 18,
Line 15, "and" should read -- and a --.

Column 19,
Line 3, "follows." should read -- follows: --.

UNITED STATES PATENT AND TRADEMARK OFFICE
CERTIFICATE OF CORRECTION

PATENT NO. : 6,294,478 B1
DATED : September 25, 2001
INVENTOR(S) : Kiyofumi Sakaguchi et al.

It is certified that error appears in the above-identified patent and that said Letters Patent is hereby corrected as shown below:

Column 23,
Line 67, "a-Si" should read -- a Si --.

Column 27,
Line 65, "layer" should read -- layers --.

Column 40,
Line 29, "process" should read -- process of --; and
Line 61, "spreaded" should read -- spread --.

Column 41,
Line 3, "soak in" should read -- soaking --.

Signed and Sealed this

Twelfth Day of August, 2003

JAMES E. ROGAN
*Director of the United States Patent and Trademark Office*